United States Patent
Nazarian et al.

(10) Patent No.: US 10,096,362 B1
(45) Date of Patent: Oct. 9, 2018

(54) SWITCHING BLOCK CONFIGURATION BIT COMPRISING A NON-VOLATILE MEMORY CELL

(71) Applicant: Crossbar, Inc., Santa Clara, CA (US)

(72) Inventors: Hagop Nazarian, San Jose, CA (US); Sung Hyun Jo, Sunnyvale, CA (US)

(73) Assignee: CROSSBAR, INC., Santa Clara, CA (US)

( * ) Notice: Subject to any disclaimer, the term of this patent is extended or adjusted under 35 U.S.C. 154(b) by 0 days.

(21) Appl. No.: 15/469,179

(22) Filed: Mar. 24, 2017

(51) Int. Cl.
| | |
|---|---|
| *G11C 11/00* | (2006.01) |
| *G11C 13/00* | (2006.01) |
| *H01L 27/24* | (2006.01) |
| *H01L 45/00* | (2006.01) |

(52) U.S. Cl.
CPC ........ *G11C 13/0069* (2013.01); *G11C 13/004* (2013.01); *G11C 13/0011* (2013.01); *G11C 13/0097* (2013.01); *H01L 27/2436* (2013.01); *H01L 27/2463* (2013.01); *H01L 45/085* (2013.01); *H01L 45/1233* (2013.01); *H01L 45/1266* (2013.01); *H01L 45/145* (2013.01); *H01L 45/146* (2013.01); *H01L 45/148* (2013.01); *H01L 45/1608* (2013.01); *G11C 2213/11* (2013.01); *G11C 2213/32* (2013.01);
(Continued)

(58) Field of Classification Search
CPC .. G11C 13/004; G11C 13/0069; G11C 13/003
USPC .......... 365/148, 158, 163, 171, 173
See application file for complete search history.

(56) References Cited

U.S. PATENT DOCUMENTS

| | | | |
|---|---|---|---|
| 6,002,268 A | 12/1999 | Sasaki et al. | |
| 6,255,848 B1 | 7/2001 | Schultz et al. | |
| 6,809,981 B2 | 10/2004 | Baker | |

(Continued)

FOREIGN PATENT DOCUMENTS

| | | |
|---|---|---|
| CN | 1506972 A | 6/2004 |
| CN | 1961378 A | 5/2007 |

(Continued)

OTHER PUBLICATIONS

Liu et al., "rFPGA: CMOS-Nano Hybrid FPGA Using RRAM Components," IEEE/ACM International Symposium on Islanoscale Architectures, 2008, pp. 93-98.
(Continued)

*Primary Examiner* — Han Yang
(74) *Attorney, Agent, or Firm* — Amin, Turocy & Watson, LLP

(57) ABSTRACT

A configuration bit for a switching block routing array comprising a non-volatile memory cell is provided. By way of example, the configuration bit and switching block routing array can be utilized for a field programmable gate array, or other suitable circuit(s), integrated circuit(s), application specific integrated circuit(s), electronic device or the like. The configuration bit can comprise a switch that selectively connects or disconnects a node of the switching block routing array. A non-volatile memory cell connected to the switch can be utilized to activate or deactivate the switch. In one or more embodiments, the non-volatile memory cell can comprise a volatile resistance switching device connected in serial to a gate node of the switch, configured to trap charge at the gate node to activate the switch, or release the charge at the gate node to deactivate the switch.

20 Claims, 9 Drawing Sheets

(52) U.S. Cl.
CPC ...... *G11C 2213/33* (2013.01); *G11C 2213/34* (2013.01); *G11C 2213/79* (2013.01)

(56) References Cited

U.S. PATENT DOCUMENTS

| | | | |
|---|---|---|---|
| 6,849,891 B1 | 2/2005 | Hsu et al. |
| 6,855,975 B2 | 2/2005 | Gilton |
| 6,867,618 B2 | 3/2005 | Li et al. |
| 7,167,387 B2 | 1/2007 | Sugita et al. |
| 7,176,530 B1 | 2/2007 | Bulucea et al. |
| 7,187,577 B1 | 3/2007 | Nang et al. |
| 7,274,064 B2 | 9/2007 | Bertin et al. |
| 7,274,587 B2 | 9/2007 | Yasuda |
| 7,280,390 B2 | 10/2007 | Kostylev et al. |
| 7,368,752 B2 | 5/2008 | Luyken et al. |
| 7,388,775 B2 | 6/2008 | Bedeschi et al. |
| 7,511,532 B2 | 3/2009 | Derharcobian et al. |
| 7,579,612 B2 | 8/2009 | Tang et al. |
| 7,704,788 B2 | 4/2010 | Youn et al. |
| 7,786,464 B2 | 8/2010 | Nirschl et al. |
| 7,791,060 B2 | 9/2010 | Aochi et al. |
| 7,829,875 B2 | 11/2010 | Scheuerlein |
| 7,830,698 B2 | 11/2010 | Chen et al. |
| 7,835,174 B2 | 11/2010 | Tokiwa |
| 7,859,884 B2 | 12/2010 | Scheuerlein |
| 7,881,097 B2 | 2/2011 | Hosomi et al. |
| 7,897,953 B2 | 3/2011 | Liu |
| 7,920,412 B2 | 4/2011 | Hosotani et al. |
| 7,924,138 B2 | 4/2011 | Kinoshita et al. |
| 7,961,506 B2 | 6/2011 | Liu |
| 8,004,882 B2 | 8/2011 | Katti et al. |
| 8,018,760 B2 | 9/2011 | Muraoka et al. |
| 8,045,364 B2 | 10/2011 | Schloss et al. |
| 8,054,679 B2 | 11/2011 | Nakai et al. |
| 8,067,815 B2 | 11/2011 | Chien et al. |
| 8,102,018 B2 | 1/2012 | Bertin et al. |
| 8,102,698 B2 | 1/2012 | Scheuerlein |
| 8,139,392 B2 | 3/2012 | Hosoi |
| 8,164,948 B2 | 4/2012 | Katti et al. |
| 8,218,350 B2 | 7/2012 | Kozicki |
| 8,269,203 B2 | 9/2012 | Greene et al. |
| 8,278,170 B2 | 10/2012 | Lee et al. |
| 8,320,160 B2 | 11/2012 | Nazarian |
| 8,329,537 B2 | 12/2012 | Kim et al. |
| 8,351,241 B2 | 1/2013 | Lu et al. |
| 8,369,139 B2 | 2/2013 | Liu et al. |
| 8,411,485 B2 | 4/2013 | Nazarian et al. |
| 8,456,892 B2 | 6/2013 | Yasuda |
| 8,467,226 B2 | 6/2013 | Bedeschi et al. |
| 8,502,185 B2 | 8/2013 | Lu et al. |
| 8,587,050 B2 | 11/2013 | Ohba |
| 8,659,933 B2 | 2/2014 | Jo |
| 8,674,724 B2 | 3/2014 | Nazarian et al. |
| 8,735,247 B2 | 5/2014 | Yoo et al. |
| 8,754,671 B2 | 6/2014 | Nazarian et al. |
| 8,767,441 B2 | 7/2014 | Lu et al. |
| 8,993,397 B2 | 3/2015 | Herner |
| 9,023,719 B2 | 5/2015 | Pachamuthu et al. |
| 9,305,624 B2 | 4/2016 | Shepard |
| 2001/0007447 A1* | 7/2001 | Tanaka .................. G09G 3/3258 345/87 |
| 2004/0114413 A1 | 6/2004 | Parkinson et al. |
| 2004/0170040 A1 | 9/2004 | Rinerson et al. |
| 2006/0097238 A1 | 5/2006 | Breuil et al. |
| 2006/0231910 A1 | 10/2006 | Hsieh et al. |
| 2007/0146012 A1 | 6/2007 | Muphy et al. |
| 2007/0268744 A1 | 11/2007 | Taguchi |
| 2008/0192531 A1 | 8/2008 | Tamura et al. |
| 2008/0291719 A1 | 11/2008 | Fackenthal et al. |
| 2009/0014707 A1 | 1/2009 | Lu et al. |
| 2009/0027976 A1 | 1/2009 | Brewer et al. |
| 2009/0122592 A1 | 5/2009 | Tokiwa |
| 2009/0231910 A1 | 9/2009 | Liu et al. |
| 2009/0315092 A1 | 12/2009 | Mikasa |
| 2010/0008127 A1 | 1/2010 | Muraoka et al. |
| 2010/0124093 A1 | 5/2010 | Shiga et al. |
| 2010/0157656 A1 | 6/2010 | Tsuchida |
| 2010/0176367 A1 | 7/2010 | Liu |
| 2010/0220523 A1 | 9/2010 | Modha et al. |
| 2010/0237314 A1 | 9/2010 | Tsukamoto et al. |
| 2010/0243983 A1 | 9/2010 | Chiang et al. |
| 2010/0252909 A1 | 10/2010 | Nakanishi et al. |
| 2011/0033967 A1 | 2/2011 | Lutz et al. |
| 2011/0089391 A1 | 4/2011 | Mihnea et al. |
| 2011/0149639 A1 | 6/2011 | Carter et al. |
| 2011/0175087 A1 | 7/2011 | Yamazaki et al. |
| 2011/0205780 A1 | 8/2011 | Yasuda et al. |
| 2011/0305065 A1 | 12/2011 | Nazarian et al. |
| 2011/0310656 A1 | 12/2011 | Kreupl et al. |
| 2011/0317470 A1 | 12/2011 | Lu et al. |
| 2012/0007035 A1 | 1/2012 | Jo et al. |
| 2012/0025160 A1 | 2/2012 | Sonehara |
| 2012/0044751 A1 | 2/2012 | Wang et al. |
| 2012/0075910 A1 | 3/2012 | Yasuda |
| 2012/0112156 A1 | 5/2012 | Park et al. |
| 2012/0122290 A1 | 5/2012 | Nagashima |
| 2012/0132971 A1 | 5/2012 | Mikasa |
| 2012/0176831 A1 | 7/2012 | Xiao et al. |
| 2012/0187410 A1 | 7/2012 | Yamazaki et al. |
| 2012/0211719 A1 | 8/2012 | Haimoto et al. |
| 2012/0211722 A1 | 8/2012 | Kellam et al. |
| 2012/0236650 A1 | 9/2012 | Nazarian |
| 2012/0250395 A1 | 10/2012 | Nodin |
| 2012/0305879 A1 | 12/2012 | Lu et al. |
| 2012/0314472 A1 | 12/2012 | Chung |
| 2013/0001501 A1 | 1/2013 | Sills |
| 2013/0027081 A1 | 1/2013 | Nazarian et al. |
| 2013/0264534 A1 | 10/2013 | Hwang et al. |
| 2013/0313508 A1 | 11/2013 | Kawasaki |
| 2013/0334593 A1 | 12/2013 | Seol et al. |
| 2014/0048860 A1 | 2/2014 | Mikasa et al. |
| 2014/0063903 A1 | 3/2014 | Chang et al. |
| 2014/0092669 A1 | 4/2014 | Chen et al. |
| 2014/0098594 A1 | 4/2014 | Azuma et al. |
| 2014/0112058 A1 | 4/2014 | Kellam et al. |
| 2014/0231740 A1 | 8/2014 | Ohba |
| 2014/0284544 A1 | 9/2014 | Miyagawa et al. |
| 2014/0292365 A1 | 10/2014 | Said |
| 2015/0070966 A1 | 3/2015 | Bandyopadhyay et al. |
| 2015/0074326 A1 | 3/2015 | Castro |
| 2015/0076579 A1 | 3/2015 | Tsuji et al. |
| 2015/0179662 A1 | 6/2015 | Makala et al. |
| 2015/0179705 A1 | 6/2015 | Wouters et al. |
| 2015/0187792 A1 | 7/2015 | Shingu et al. |
| 2015/0294716 A1 | 10/2015 | Tortorelli et al. |
| 2016/0012886 A1* | 1/2016 | Nazarian .............. G11C 13/004 365/148 |
| 2016/0104715 A1 | 4/2016 | Pachamuthu et al. |
| 2016/0111639 A1 | 4/2016 | Wells et al. |
| 2016/0141337 A1 | 5/2016 | Shimabukuro et al. |
| 2016/0190208 A1* | 6/2016 | Nazarian .............. G11C 13/003 257/5 |
| 2016/0204117 A1 | 7/2016 | Liu et al. |
| 2016/0211386 A1 | 7/2016 | Tomai et al. |
| 2016/0268341 A1 | 9/2016 | Nazarian |
| 2017/0104031 A1 | 4/2017 | Clark et al. |
| 2017/0169887 A1 | 6/2017 | Widjaja |
| 2017/0352410 A1 | 12/2017 | Castro |

FOREIGN PATENT DOCUMENTS

| | | |
|---|---|---|
| CN | 101501850 A | 8/2009 |
| CN | 102986048 A | 3/2013 |
| CN | 103682091 A | 3/2014 |
| JP | 2000058681 A | 2/2000 |
| JP | 2001249324 A | 9/2001 |
| JP | 2008277543 A | 11/2008 |
| JP | 2009267185 A | 11/2009 |
| JP | 2010009669 A | 1/2010 |
| JP | 2010087007 A | 4/2010 |
| JP | 2010519762 A | 6/2010 |
| JP | 2010186872 A | 8/2010 |
| JP | 201123645 A | 2/2011 |
| JP | 2011129639 A | 6/2011 |

(56) References Cited

FOREIGN PATENT DOCUMENTS

| JP | 2014036034 A | 2/2014 |
|---|---|---|
| TW | 201214673 A | 4/2012 |
| WO | 2011005266 A1 | 1/2011 |
| WO | 2013052321 A2 | 4/2013 |

OTHER PUBLICATIONS

Office Action dated Dec. 17, 2012 for U.S. Appl. No. 13/194,479, 26 pages.
Office Action dated Sep. 25, 2013 for U.S. Appl. No. 13/194,479, 31 pages.
Notice of Allowance dated Feb. 5, 2014 for U.S. Appl. No. 13/194,479, 42 pages.
Liauw et al., Nonvolatile 3D-FPGA with Monolithically Stacked RRAM-Based Configuration Memory, IEEE Solid State Circuits Conference, 2012, pp. 406-408.
Office Action dated Feb. 5, 2015 for U.S. Appl. No. 14/166,700, 32 pages.
Office Action dated Jan. 17, 2013 for U.S. Appl. No. 13/194,500, 26 pages.
Notice of Allowance dated Oct. 28, 2013 for U.S. Appl. No. 13/194,500, 23 pages.
Notice of Allowance dated Jan. 28, 2014 for U.S. Appl. No. 13/194,500, 17 pages.
Office Action dated Aug. 19, 2016 for U.S. Appl. No. 14/335,507, 36 pages.
Korean Office Action dated Oct. 30, 2017 for Korean Application No. 10-2015-0096673, 7 pages (including English translation).
European Office Action and Search Report dated Oct. 18, 2017 for European Application No. 15762196.2, 7 pages.
Office Action dated Aug. 21, 2017 for U.S. Appl. No. 14/726,071, 93 pages.
Notice of Allowance dated Jul. 31, 2017 for U.S. Appl. No. 15/195,458, 58 pages.
Office Action dated Aug. 29, 2017 for U.S. Appl. No. 15/256,007, 59 pages.
Search Report dated Dec. 27, 2016 for Chinese Patent Application No. 201510105630.X, 1 page.
Office Action dated Oct. 30, 2017 for U.S. Appl. No. 15/495,574, 48 pages.
Chinese Office Action dated Dec. 11, 2017 for Chinese Patent Application No. 201510260810.5, 6 pages (including English translation).
Office Action dated Jan. 11, 2018 for U.S. Appl. No. 14/793,392, 53 pages.
Office Action dated Jan. 17, 2018 for U.S. Appl. No. 14/726,071, 99 pages.
Office Action dated Jan. 26, 2017 for U.S. Appl. No. 14/793,392, 39 pages.
Communication pursuant to Rules 70(2) and 70a(2) EPC dated Nov. 7, 2017 issued in European Application No. 15762196.2, 1 page.
Office Action dated Dec. 6, 2013 for U.S. Appl. No. 13/960,735, 19 pages.
Office Action dated Mar. 17, 2015 for U.S. Appl. No. 14/573,770, 19 pages.
Wouters, "Scaling challenges for 2-terminal select devices," ITRS ERD Selector Workshop, Apr. 2012, 41 pages, IMEC, Noorderwijk, NL.
Office Action dated May 27, 2015 for U.S. Appl. No. 14/588,185, 23 pages.
Office Action dated Jun. 19, 2012 for U.S. Appl. No. 13/149,757, 11 pages.
International Search Report and Written Opinion for PCT Application No. PCT/US2015/17370 dated Jul. 13, 2015, 17 pages.
Office Action dated Oct. 3, 2013 for U.S. Appl. No. 13/921,157, 10 pages.
International Search Report and Written Opinion for PCT Application No. PCT/US2012/040232 dated Feb. 26, 2013, 9 pages.
Office Action dated May 7, 2013 for U.S. Appl. No. 13/585,759, 12 pages.
Office Action dated May 23, 2013 for U.S. Appl. No. 13/592,224, 9 pages.
Notice of Allowance dated Sep. 19, 2013 for U.S. Appl. No. 13/585,759, 9 pages.
Office Action dated Dec. 6, 2013 for U.S. Appl. No. 13/960,735, 10 pages.
International Search Report and Written Opinion for PCT Application No. PCT/US2013/054976 dated Dec. 16, 2013, 9 pages.
Notice of Allowance dated Jul. 22, 2015 for U.S. Appl. No. 14/612,025, 11 pages.
Chinese Office Action (with English translation) dated Nov. 23, 2015 for Chinese Patent Application No. 201280027066.9, 12 pages.
Office Action dated Aug. 3, 2015 for U.S. Appl. No. 14/717,185, 26 pages.
Ex Parte Quayle Office Action dated Aug. 18, 2016 for U.S. Appl. No. 14/795,105, 13 pages.
Office Action dated Apr. 8, 2016 for U.S. Appl. No. 14/573,770, 8 pages.
office Action dated Jul. 14, 2016 for U.S. Appl. No. 14/793,392, 28 pages.
Office Action dated Jul. 13, 2016 for U.S. Appl. No. 14/755,998, 22 pages.
Office Action dated May 31, 2016 for U.S. Appl. No. 14/678,112, 14 pages.
Notice of Allowance dated Oct. 20, 2016 for U.S. Appl. No. 15/066,504, 28 pages.
Japanese Office Action dated Aug. 2, 2016 for Japanese Application No. 2015-102280, 13 pages (including translation).
Taiwanese Office Action dated Aug. 19, 2016 for Taiwanese Application No. 104107381, 7 pages (including translation).
Japanese Office Action dated Aug. 9, 2016 for Japanese Application No. 2015-137033, 6 pages (including translation).
Taiwanese Office Action dated Aug. 11, 2016 for Taiwanese Application No. 104121989, 10 pages (including translation).
Taiwanese Office Action dated Oct. 19, 2016 for Taiwanese Application No. 104122122, 7 pages (including translation).
Office Action dated Dec. 22, 2016 for U.S. Appl. No. 14/641,466, 45 pages.
Office Action dated Dec. 29, 2016 for U.S. Appl. No. 15/195,417, 38 pages.
Chinese Office Action dated Dec. 27, 2016 for Chinese Patent Application No. 201510105630.X, 16 pages (including English translation).
Korean Office Action dated Feb. 27, 2017 for Korean Application No. 10-2015-0096673, 7 pages (including English translation).
Korean Office Action dated Mar. 6, 2017 for Korean Application No. 10-2015-0097600, 5 pages (including English translation).
Chinese Office Action dated Apr. 5, 2017 for Chinese Patent Application No. 201510260810.5, 16 pages (including English translation).
Office Action dated Jul. 6, 2016 for U.S. Appl. No. 14/726,071, 25 pages.
Office Action dated Dec. 15, 2016 for U.S. Appl. No. 14/726,071, 62 pages.
Wolf, "Silicon Processing for the VLSI Era vol. 3: The Submicron Mosfet", Lattice Press, 1995, pp. 200-201.
Office Action dated Mar. 30, 2017 for U.S. Appl. No. 14/726,071, 64 pages.
Final Office Action dated May 25, 2018 for U.S. Appl. No. 15/256,007.
Search Report dated Jul. 8, 2016 for Japanese Application No. JP2015-137033, 16 pages.
Notice of Allowance dated Jul. 2, 2018 for U.S. Appl. No. 15/797,447, 38 pages.

* cited by examiner

SWITCHING BLOCK CONFIGURATION BIT COMPRISING A NON-VOLATILE MEMORY CELL

INCORPORATION BY REFERENCE

U.S. application Ser. No. 14/717,185 entitled "NON-VOLATILE MEMORY CELL UTILIZING VOLATILE SWITCHING TWO TERMINAL DEVICE AND A MOS TRANSISTOR" and filed May 20, 2015, U.S. application Ser. No. 14/588,185 entitled "SELECTOR DEVICE FOR TWO-TERMINAL MEMORY" and filed Dec. 31, 2014, U.S. patent application Ser. No. 14/726,071 entitled "RECESSED HIGH VOLTAGE METAL OXIDE SEMICONDUCTOR TRANSISTOR FOR RRAM CELL" and filed May 29, 2015, U.S. application Ser. No. 15/066,504 entitled SELECTOR-BASED NON-VOLATILE CELL FABRICATION UTILIZING IC-FOUNDRY COMPATIBLE PROCESS" and filed Mar. 10, 2016, U.S. application Ser. No. 13/194,479 filed Jul. 29, 2011, U.S. application Ser. No. 13/194,500 filed Jul. 29, 2011, U.S. application Ser. No. 14/304,572 filed Jun. 13, 2014, U.S. application Ser. No. 14/166,700 filed Feb. 28, 2014, and U.S. application Ser. No. 14/335,507 filed Jul. 18, 2014, are each hereby incorporated by reference herein in their respective entireties and for all purposes.

TECHNICAL FIELD

The subject disclosure relates generally to a switching block routing array, and as an illustrate example, a configuration bit for a node of the switching block routing array comprising a non-volatile memory cell.

BACKGROUND

The inventor(s) of the present disclosure has proposed models of two-terminal memory devices that he expects to operate as viable alternatives to various memory cell technologies, such as metal-oxide semiconductor (MOS) type memory cells employed for electronic storage of digital information. Models of memory cells using two-terminal memory such as resistive-switching memory devices among others, are believed by the inventor(s) to provide some potential advantages over purely non-volatile FLASH MOS type transistors, including smaller die size, higher memory density, faster switching (e.g., from a relatively conductive state to a relatively non-conductive state, or vice versa), good data reliability, low manufacturing cost, fab-compatible processes, and other advantages, for example.

One two-terminal memory expected to have promising physical characteristics is resistive memory. While much of resistive memory technology is in the development stage, various technological concepts for resistive memory have been demonstrated by the assignee of the present invention and are in one or more stages of verification to prove or disprove associated theory(ies). Even so, resistive memory technology promises to hold substantial advantages over competing technologies in the semiconductor electronics industry.

As models of resistive memory technology are tested and results obtained, the results are speculatively extrapolated to memory devices in which resistive memory replaces a conventional memory. For instance, the assignee of the present invention has conducted research related to software models of memory arrays comprising resistive memory instead of complementary metal-oxide semiconductor (CMOS) NAND or NOR memory. Software projections suggest that two-terminal memory arrays can provide significant benefits for electronic devices, including reduced power consumption, higher memory density, advanced technology nodes, or improved performance, among others. In light of the above, the inventors endeavor to discover applications where two-terminal memory can provide real-world benefits for electronic devices.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

In embodiments of the present disclosure, there is provided a configuration bit for a switching block routing array comprising a non-volatile memory cell. The configuration bit and switching block routing array can be utilized for a field programmable gate array, or other suitable circuit(s), integrated circuit(s), application specific integrated circuit(s), electronic device or the like, or suitable combinations of the foregoing. In some embodiments, the configuration bit can comprise a switch that selectively connects or disconnects a node of the switching block routing array. A non-volatile memory cell connected to the switch can be utilized to activate or deactivate the switch. In one or more embodiments, the non-volatile memory cell can comprise a volatile resistance switching device connected in serial to a gate node of the switch, configured to trap charge at the gate node to activate the switch, or release the charge at the gate node to deactivate the switch.

In various embodiments, a disclosed configuration bit can have small silicon footprint and high scalability, facilitating high configuration bit density compared to conventional configuration bits. In addition, disclosed configuration bits can have fast switching speeds, high bit reliability and excellent longevity. Accordingly, the disclosed configuration bits can facilitate significant improvements for switching block technologies and field programmable gate array technology in general.

In an embodiment(s), the subject disclosure provides a circuit. The circuit can comprise a non-volatile switch comprising an input node, an output node and a control gate, the input node connected to a first conductive line of a switching block routing array and the output node connected to a second conductive line of the switching block routing array. Moreover, the circuit can comprise a volatile switch having a first contact and a second contact, the second contact is conductively connected to the control gate of the non-volatile switch and a program circuit configured to selectively provide a voltage source to the first contact of the volatile switch.

In other embodiments, the subject disclosure provides a configuration bit for a node of a switching block routing array. The configuration bit can comprise a transistor element having a control gate, a first terminal coupled to an input node of the switching block routing array and a second terminal coupled to an output node of the switching block routing array. Further, the configuration bit can comprise a two-terminal volatile resistive switching device, having a second electrode connected to the control gate and a first electrode and a programming input provided to the first electrode of the two-terminal volatile resistive switching device. In one or more embodiments, the programming input supplies a signal to the two-terminal volatile resistive switching device via the first electrode and the two-terminal volatile resistive switching device has a high resistance state in response to a magnitude of the signal being zero or about zero. Moreover, in some embodiments, the two-terminal volatile resistive switching device transitions to a low resistance state in response to the magnitude increasing to a non-zero threshold voltage and the two-terminal volatile resistive switching device transitions from the low electrical resistance to the high electrical resistance in response to the magnitude decreasing below the non-zero threshold voltage, or below a second non-zero threshold voltage.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Figure 1:
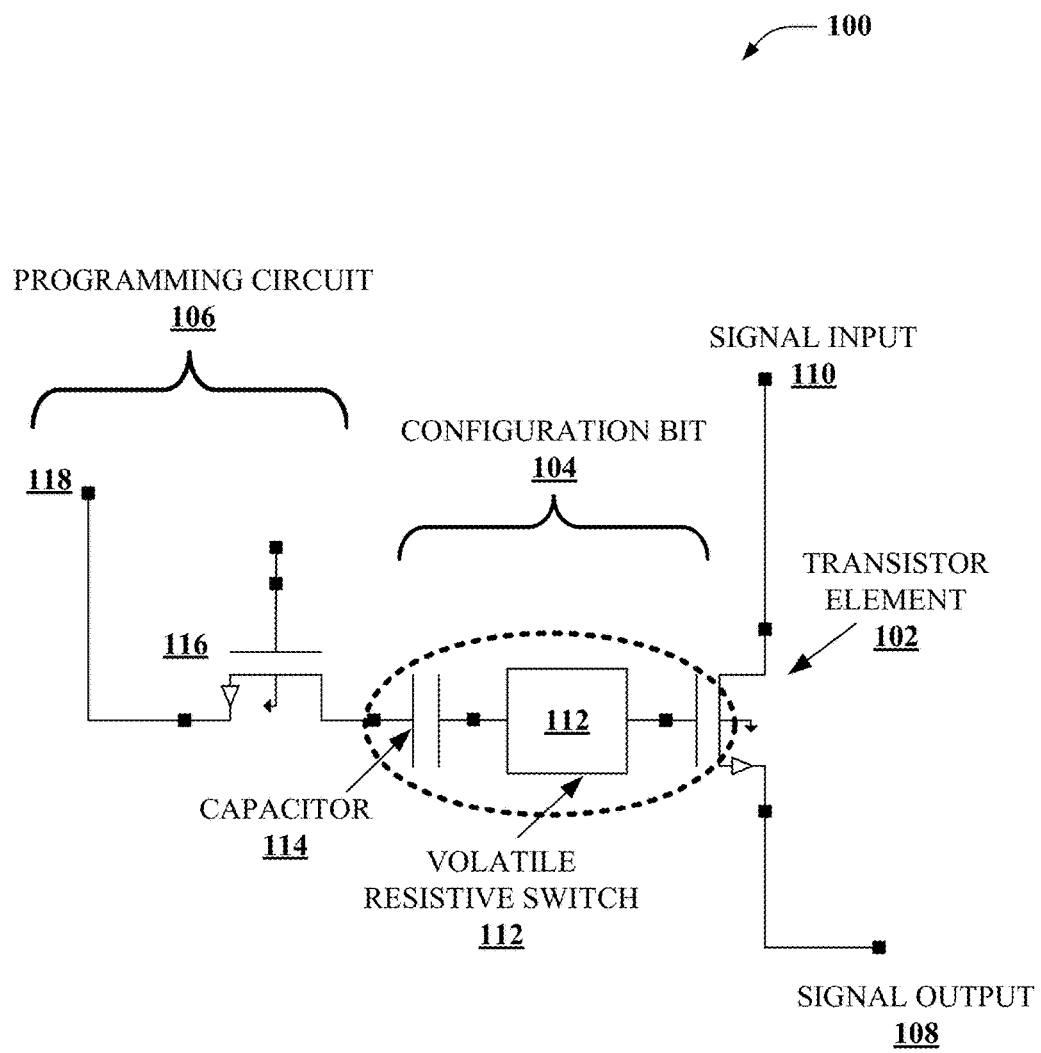
FIG. 1 depicts a schematic diagram of an example configuration bit for a node of a field programmable gate array, in one or more embodiments.

This disclosure relates to a configuration bit for a node of a switching block routing array (also referred to herein as a switching block). Also disclosed is an integrated circuit comprising multiple (e.g., many) of the configuration bits respectively connected at one of multiple nodes of the switching block. The integrated circuit can further comprise a field programmable gate array (FPGA) utilizing one or more of such switching blocks and multiple configuration bits.

In one or more herein embodiments, a disclosed configuration bit comprises a non-volatile memory device having one or more volatile elements. In some embodiments, the non-volatile memory device can include a resistive two-terminal selector device that can be in a low resistive state or a high resistive state in response to respective stimuli (e.g., a voltage, a field, a current, etc.), or respective ranges of stimuli (e.g., a few millivolts, a few microamps, etc.) applied to the resistive two-terminal selector device. The selector device can be a volatile switching device with multiple thresholds (or narrow threshold ranges) (e.g., one or more positive thresholds and one or more negative thresholds). In at least one embodiment, the selector device can have multiple distinct low resistance states, operable as a multi-level (ML) volatile switching element. As an illustrative example, the selector device is a resistive switching device, or a field induced superlinear threshold (FAST™) switching device (or selector device) under development by the assignee of the present invention.

In addition to the resistive two-terminal selector device, the non-volatile memory device can optionally include a capacitor structure and a MOS ("metal-oxide-semiconductor") transistor (which can act or operate as a switch for a node of a switching block routing array). The capacitor can be a PMOS transistor in one or more embodiments, and in other embodiments can be a metal-insulator-metal capacitor, although other suitable capacitors can be employed. A first terminal of the capacitor can be coupled to a voltage source, and the second terminal of the capacitor can be coupled to a first selector terminal of the selector device. In embodiments where the capacitor is not included, the voltage source can be connected to the first selector terminal of the selector device.

In one or more embodiments, the MOS transistor can be an NMOS transistor comprising a floating gate connected to a second selector terminal of the selector device. Electrical conductivity between a source and drain of the NMOS transistor is modulated by a charge magnitude stored on the MOS transistor gate which is floating (e.g., typically not connected to a power source) during read operation. In various embodiments, the source (or drain) is connected to an input of a switching block node, and the drain (or source) is connected to an output of the switching block node. In such embodiments, when the MOS transistor is activated (or at one of a set of activated values) electrical continuity between the input and output of the switching block node is achieved (e.g., high conductivity at the node). In contrast, when the MOS transistor is deactivated, there is electrical discontinuity between the input and output of the switching block node (e.g., low conductivity at the node). In some embodiments, the NMOS transistor can be a deep trench transistor having a low profile gate, reducing substrate surface area consumed by the configuration bit.

In various disclosed embodiments, a disclosed volatile selector device (volatile resistive switch) can be a filamentary-based device. One example of a filamentary-based device can comprise: a first conductive layer comprising a first metal-containing layer (e.g., a metal bearing layer such as TiN, TaN, Cu, Al, Ag, or alloy or compound thereof (the alloy including, e.g. Cu, Al, Ag, Mn, Mg, Si, Zn, N, etc.)), a doped semiconductor layer, etc.; a resistive switching layer (RSL) having relatively few particle-trapping defect sites (e.g., an undoped a-Si, a non-stoichiometric material, e.g. a non-stoichiometric silicon sub-oxide ($SiO_x$ where x is within a range from about 0.1 to about 2.0, a silicon sub-oxynitride, a silicon sub-nitride, a metal nitride (e.g. aluminum nitride or sub-nitride), etc.)); and a second conductive layer (e.g. a material selected from the list described for the first conductive layer, which can be the same as a first material selected for the first conductive layer, or can be different from the first material).

In some embodiments, the metal-containing layer(s) of the first conductive layer or the second conductive layer can include an alloy or compound of one or more metals, and of one or more nonmetals (including metalloids or any non full metal). For an alloy, the metal(s) and nonmetal(s) can be blended in a suitable ratio to form a material suitable to provide metal particles to the RSL that are capable of being ionized and that can drift readily within the RSL in response to an external stimulus. As one example, a ratio of greater than or approximately equal to 95% metal and less than or approximately equal to 5% nonmetal can be utilized. For instance, an alloy of Cu, Al, Ag, Ti, Ta, Mn, Mg, Zn at respective suitable values of greater than or equal 95% (e.g., 95%, 96%, 97%, 98%, 99%, <100%, or values there between) can be combined with N, Si, or other suitable nonmetal at concentration equal or less than 5% (e.g., 5%, 4%, 3%, 2%, 1%, >0%, or suitable values there between). For a compound, a metal(s) and nonmetal(s) suitable to provide molecules capable of being ionized and that drift readily within an RSL in response to a stimulus can be utilized. Alternatively, a metal and nonmetal compound suitable to break chemical bond(s) in response to an applied stimulus, and dissociate to the elemental metal and nonmetal can be utilized, where the elemental nonmetal ionizes in response to the applied stimulus and readily drifts within the RSL.

Under suitable bias conditions, conductive ions form within the first conductive layer, and the first conductive layer provides the conductive ions to the RSL, e.g. the conductive ions diffuse into the RSL. In various embodiments, a bias may be an applied voltage exceeding a magnitude of a threshold voltage (or small range of voltages, e.g., within about five to ten percent of the magnitude of the threshold voltage), including a positive threshold voltage(s), and a negative threshold voltage(s)). In various embodiments, after the bias exceeds the positive threshold voltage, the conductive ions remain diffused within the RSL until a deformation condition occurs. In the absence of current flowing through the RSL, the deformation condition can occur in response to the bias magnitude dropping below the positive threshold voltage. While current flows through the RSL, the deformation condition can be the bias dropping below a magnitude of a hold voltage (that may be smaller than the magnitude of the threshold voltage). As one non-limiting example, a threshold voltage may be (about) 1.1 volts, and a hold voltage may be (about) 0.5 volts for a current of several microamps or more flowing through the RSL. In various disclosed embodiments, when utilized for a configuration bit of a switching block node, the current through the RSL is less than that which would give ride to the hold voltage, and thus the deformation condition of the conductive ions is met in response to the voltage magnitude dropping below the magnitude of the threshold voltage(s).

In some embodiments, in the absence of the bias above the hold voltage or the threshold voltage, the conductive filament can at least in part deform, breaking electrical continuity of the conductive filament within the RSL. This can result (although not limited by theory) from a surface energy of the metal particles exceeding stabilizing influences keeping the particles in place (e.g., surface tension of surrounding molecules, voids/defects/trapping sites within the RSL, an ionizing electric field, etc.) resulting in particle diffusion within the RSL. This particle diffusion can facilitate a break in electrical continuity of the conductive filament, restoring the RSL to an intrinsic high resistance state. In some embodiments, as the bias falls below the hold voltage, e.g. bias is 0 volts, conductive ions may at least partially diffuse back out of the RSL. The conductive ions typically revert to neutral conductive metal particles upon absence of the external bias. In various embodiments, few neutral conductive metal particles are trapped within the RSL upon absence of the bias, because the RSL has a low number of crystalline defects. In absence of the conductive channel, the resistance of the RSL has a much higher resistance than the resistance of the RSL under bias (with the conductive channel). A ratio between resistances of the RSL can range from 10E7 to 10E9 and sometimes greater.

According to further embodiments, the second conductive layer can also comprise neutral metal particles capable of being ionized. In such embodiments, the second conductive layer can form metal ions and provide the metal ions to the RSL in response to a second suitable bias condition(s), in a similar manner as described above. In some embodiments, the threshold voltage for the first conductive layer to ionize and the threshold voltage for the second conductor layer to ionize may be similar or different, according to engineering design factors. The polarities of these threshold voltages in response to the suitable bias condition(s) and the second suitable bias condition(s), respectively, are typically opposite of each other.

A RSL (which can also be referred to in the art as a resistive switching media (RSM)) can comprise, e.g., an undoped amorphous Si layer, a semiconductor layer having intrinsic characteristics, a Si sub-oxide (e.g., SiOx wherein x has a non-zero value less than 2), a silicon oxynitride, a silicon sub-oxynitride, a silicon nitride, a silicon sub-nitride, a metal nitride (e.g. aluminum nitride or sub-nitride) and so forth. Other examples of materials suitable for the RSL could include $Si_XGe_YO_Z$ (where X, Y and Z are respective suitable positive numbers), a silicon oxide (e.g., $SiO_N$, where N is a suitable positive number), amorphous Si (a-Si), amorphous SiGe (a-SiGe), $TaO_B$ (where B is a suitable positive number), $HfO_C$ (where C is a suitable positive number), $TiO_D$ (where D is a suitable number), $Al_2O_E$ (where E is a suitable positive number), a non-stoichiometric silicon-bearing material, a non-stoichiometric metal oxide, a metal nitride (e.g. an aluminum nitride or sub-nitride), and so forth, or a suitable combination thereof. In various embodiments, the RSL includes few or a low number of material voids or defects (e.g. crystalline) which can trap conductive particles; accordingly, in some embodiments, the conductive particles have relatively good diffusive or drift mobility within the RSL, or can quickly form a very narrow conductive filament in response to a suitable threshold bias, or a combination of the foregoing.

In various disclosed embodiments, filamentary-based switching devices are disclosed and their operation is described. In some embodiments, a filamentary-based switching device can be a volatile switching device, which exhibits a first measurably distinct state in the absence of a suitable external stimulus (or stimuli), and exhibits a second measurably distinct state in response to the suitable external stimulus (or stimuli). The volatile filamentary-based switching device is often referred to herein as a selector device, or selection device, filamentary selector device, filamentary-based selector device, a volatile switching device, a volatile two-terminal switching device, a volatile resistance-switching device, and so on; though such devices, their composition or application should not be limited by this terminology. In various embodiments, a filamentary selector device is provided in a circuit to facilitate formation of a non-volatile memory cell, having very fast performance. In some embodiments, the non-volatile memory cell can have a read performance less than 20 nanoseconds (ns), less than 10 nanoseconds, or between 1 ns and 5 ns, in various embodiments. In various embodiments, a FAST™ selector device under development by the current assignee is to be used.

A filamentary selector device according to various disclosed embodiments can exhibit a first state (e.g., a first electrical resistance, or other suitable measurable characteristic) in the absence of a suitable external stimulus (or stimuli). The stimulus (or stimuli) can have a threshold value or range of such values that induces the filamentary selector device to change from the first state to a second state while the stimulus is applied. In response to the stimulus falling below the threshold value (or outside of the threshold range of values) the filamentary selector device returns to the first state. In some disclosed embodiments, a filamentary based selector device can operate in a bipolar fashion, behaving differently in response to different polarity (or direction, energy flow, energy source orientation, etc.) external stimuli. As an illustrative example, in response to a first polarity stimulus exceeding a first threshold voltage (or set of voltages), the filamentary selector device can change to the second state from the first state. Moreover, in response to a second polarity stimulus exceeding a second threshold voltage(s), the filamentary selector device can change to a third state from the first state. In some embodiments, the third state can be substantially the same as the first state, having the same or similar measurably distinct characteristic (e.g., electrical conductivity, and so forth), or switching in response to the same or similar magnitude of threshold stimulus, or range thereof, (though of opposite polarity or direction), or the like. In other embodiments, the third state can be distinct from the second state, either in terms of the measurable characteristic (e.g., different reverse electrical conductivity value in response to the reverse polarity as compared to a forward electrical conductivity value in response to the forward polarity) or in terms of threshold stimulus associated with transitioning out of the first state (e.g., a different magnitude of positive voltage required to transition to the second state, compared to a magnitude of negative voltage required to transition to the third state).

In other embodiments, the selector device may be a unipolar device, having a single threshold voltage. When an applied voltage, at least between ground and the threshold voltage is applied, the selector device has a high characteristic resistance. Further, when the applied voltage has a magnitude greater than the threshold voltage (e.g. more positive than a positive threshold voltage, or more negative than a negative threshold voltage), the selector device has a low characteristic resistance. In some embodiments, two unipolar devices may be placed in parallel, with opposite polarity. It is expected that such a configuration of unipolar devices would provide a characteristic response similar to the bipolar selector device, described above.

As stated above, a disclosed filamentary based selector device can form a conductive path or filament through a relatively high resistive portion in response to a suitable external stimulus (or range of stimulus). The external stimulus (or stimuli) can cause metallic particles within a terminal of the selector device (e.g., active metal layer terminal, conductive layer terminal, etc.) to migrate within (or ionize within) a RSL layer of the filamentary selector device. Further, the RSL can be selected to have relatively few physical defect locations for the volatile filamentary switching device, facilitating relatively good mobility of the metallic particles within the RSL, formation of a very narrow (e.g., only a few particles wide, or less) conductive filament, or the like, or a combination of the foregoing. Accordingly, with respect to a forward direction and positive polarity stimulus, below an associated positive threshold stimulus (or narrow range of positive threshold values), the metallic particles can disperse within the RSL, resisting or avoiding formation of a sufficient conductive path through the RSL to lower a high resistance associated with the first state. Above the threshold, the external stimulus maintains (or forms) the metallic particles in sufficient formation to provide the conductive path, leading to relatively low resistance of the second state. An analogous mechanism can control operation of the third state (in a reverse direction and reverse polarity stimulus) in the bipolar context.

OVERVIEW

The volatile element of disclosed non-volatile memory cells, the selector device, can have a low resistance state and a high resistance state based on the voltage being applied by the voltage source to the first terminal of the capacitor. Between a range of deactivation voltages (e.g., from a negative threshold voltage to a positive threshold voltage, or other suitable positive range, negative range, or range spanning positive and negative voltages) the resistance can be very high, whereas outside the range of deactivation voltages, the resistance can be much lower, facilitating current flow (and charge transfer) across the selector device. As a magnitude of voltage across the selector device, starting within the range of deactivation voltages, is increased (e.g., increasing with time), charge first accumulates very slowly on the gate of the MOS transistor connected to a second terminal of the selector device. Once the magnitude of the voltage leaves the range of deactivation voltages and exceeds a first threshold voltage (e.g., a positive threshold, or a narrow range of positive threshold voltages), the selector device enters the low resistance state and conducts current to the gate of the MOS transistor, enabling charge to accumulate much more quickly on the gate of the MOS transistor. As the voltage decreases below the positive threshold (or narrow range of positive threshold voltages), the selector device enters the high resistance state and becomes non-conductive. The non-conductivity of the selector device serves to trap charge that accumulated at the gate of the MOS transistor, as stated above. When the voltage source returns to zero, for example, the charge trapped at the gate of the MOS transistor can still remain, resulting in a measurable potential difference greater than zero (e.g., about 0.5 volts, about 0.75 volts, about 1 volt, or any other suitable voltage measurably distinct from zero). This trapped measurable charge can cause the MOS transistor to be in a second state, different from a first state in which less charge is trapped at the gate of the MOS transistor (e.g. first state: non-conducting, second state: conducting). The two states of the MOS transistor provide a bit of non-volatile storage.

In an erase cycle, a decreasing negative voltage is applied, and while the selector device is in a high resistance state, charge at the gate of the MOS transistor decreases slowly. Once the selector device switches to the low resistance state, the charge decreases more rapidly with decreasing negative voltage. The selector device switching to the low resistance state occurs when the decreasing negative voltage again leaves the range of deactivation voltages (e.g., drops below a negative threshold voltage, or narrow range of negative threshold voltages). The positive charge stored at the gate of the MOS transistor generated by the positive voltage (described above) decreases rapidly (e.g., the amount of positive charges is reduced, the gate stores a negative charge, or the like in various embodiments) and changes a state of the MOS transistor from the second state back to the first state (e.g. from conducting to non-conducting state). In some embodiments, negative charge accumulates quickly with the selector device in the low resistance state, and then as the applied voltage returns to zero and the selector device returns to the high resistant state, a negative charge remains accumulated on the gate of the MOS transistor. Since the current leakage of the selector device can be very low (e.g., measured in atto-amps in at least some disclosed embodiments), the charge on the gate of the MOS transistor can retain a magnitude suitable to maintain the changed state of the MOS transistor for a long period of time. These two different stable states of positive charge and negative charge accumulation on the gate of the MOS transistor provide non-volatile characteristics for the disclosed memory cells.

In various disclosed embodiments, a configuration bit for a field programmable gate array (FPGA) is provided. A FPGA is an integrated circuit that can be configured after manufacturing. It is a flexible device having a great number of potential configuration modes to interact with various other hardware and software designs (e.g., on a computer motherboard). The FPGA configuration is generally specified using a hardware description language, similar to that used for an application specific integrated circuit (ASIC). Generally speaking, an FPGA can be configured to implement most or all logic functions that an ASIC could execute, yet also can be at least partially reconfigured after shipping. Coupled with relatively low design costs typically associated with ASIC design, FPGAs offer significant advantages for a wide array of electronic devices and applications.

The FPGA architecture generally comprises a set of programmable logic components, or logic blocks, and reconfigurable interconnects for selectively connecting a subset of the logic blocks with other subsets thereof. Logic blocks can be configured to execute complex algorithms, or simple logic functions like AND, NAND, NOR, etc. Many FPGAs can also include memory elements. Examples of suitable memory elements can include flip-flops, memory registers, memory arrays, and so forth.

One fundamental component of an FPGA is the programmable switching block, which acts as a programmable signal routing matrix (e.g., see FIG. 5, infra). A switching block comprises a set of signal input lines (e.g., parallel to each other) intersected by a set of signal output lines (e.g., also parallel to each other). At a junction of respective signal input lines and signal output lines is a switch controlled by a configuration cell (also referred to herein as a configuration bit). Selective activation or deactivation of subsets of configuration cell switches at respective signal input/signal output junctions facilitates selective programming of the programmable switching block. Particularly, a configuration cell at a given junction can be activated to electrically connect or route a signal input line to a signal output line at that junction, or can be deactivated to electrically isolate the signal input line and signal output line at that junction. The ability to activate or deactivate respective junctions facilitates programming of the programmable switching block. Examples of programmable switching blocks and innovative mechanisms for FPGA configuration can be found in the following U.S. Patents and U.S. Patent Applications incorporated by reference herein: U.S. Pat. No. 8,754,671 issued from U.S. application Ser. No. 13/194,479 filed Jul. 29, 2011, U.S. Pat. No. 8,674,724 issued from U.S. application Ser. No. 13/194,500 filed Jul. 29, 2011, U.S. Pat. No. 9,054,702B2 issued from U.S. patent application Ser. No. 14/304,572 filed Jun. 13, 2014, U.S. Pat. No. 9,191,000 issued from U.S. application Ser. No. 14/166,700 filed Feb. 28, 2014, U.S. patent application Ser. No. 14/335,507 filed Jul. 18, 2014.

Non-Limiting Examples of a Configuration Bit Comprising a Non-Volatile Cell Formed from a Volatile Resistance Switch Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of disclosure may be practiced without these specific details, or with other methods, components, materials, etc. In other instances, well-known structures and devices are shown in block diagram form to facilitate describing the subject disclosure.

Embodiments of the present disclosure relate to a configuration cell for a switching block of a field programmable gate array (FPGA). The configuration cell can include a non-volatile memory formed in part from a volatile resistive switching device. An output of the non-volatile memory can control a switch at a junction node of the switching block. A programming circuit activates or deactivates the non-volatile memory to operate the switch, as described herein. The disclosed configuration bit can have high density, optionally formed in part in back-end layers of an integrated circuit chip and minimizing silicon space consumed by the configuration bit. In some embodiments, a disclosed configuration bit can operate at relatively low voltage (e.g., less than about 3.5 volts), consume minimal power when programmed, and maintain control of the junction node switch for a long duration (e.g., several years) in the absence of external power. Moreover, disclosed configuration bits can be fairly easy to fabricate, mitigating manufacturing cost and improving efficiency of an associated FPGA circuit.

In at least one embodiment, a non-volatile memory of a disclosed configuration bit can be embedded as part of the logic process circuitry of the FPGA. Accordingly, the FPGA can mitigate or avoid a need for separate Flash memory for initialization of routing multiplexers, look up tables, or other FPGA switching block applications. The embedded non-volatile memory also provides an integral resistance to data loss from unexpected power loss, or the like, affecting conventional FGPA circuits.

Referring now to the drawings, FIG. 1 illustrates a schematic diagram of a sample configuration circuit 100 for a node of a switching block, in one or more embodiments of the present disclosure. Configuration circuit 100 can comprise a transistor element 102 connected to a signal input 110 and a signal output 108 of the switching block. When activated, transistor element 102 electrically connects signal input 110 to signal output 108; when deactivated, transistor element 102 electrically disconnects signal input 110 from signal output 108. Activation and deactivation of transistor element 102 can be controlled at a gate node of transistor element 102.

Configuration circuit 100 can further comprise a configuration bit 104 and a programming circuit 106 to control the gate node of transistor element 102. Programming circuit 106 includes a program transistor 116 in an embodiment, configured to electrically connect or electrically isolate a first contact of configuration bit 104 from a signal source 118 (e.g., voltage source, current source, etc.; see 402A and 402B of FIGS. 4A and 4B, respectively). Configuration bit 104 can comprise a volatile resistive switch 112 and, in some disclosed embodiments, a capacitor 114. Volatile resistive switch 112 can be a filamentary switching device, in one or more embodiments, such as a FAST™ selector device developed by the Assignee of the present application for patent (e.g., see also U.S. application Ser. No. 14/588,185 filed Dec. 31, 2014 incorporated by reference herein). In operation, configuration bit 104 can be configured to accumulate charge at the gate node of transistor element 102 in response to a program signal at signal source 118 provided by programming circuit 106 (e.g., see FIG. 4A, infra), and configured to reduce charge (or accumulate negative charge) accumulated at the gate node of transistor element 102 in response to an erase signal at signal source 118 provided at programming circuit 106 (e.g., see FIG. 4B, infra). Transistor element 102, in an embodiment, is selected to be a NMOS transistor that is activated in response to a positive activation bias at the gate node, and deactivated when a bias at the gate node drops below the positive activation bias. Other embodiments can include transistor element 102 as a PMOS transistor that activates in response to a negative activation bias and deactivates in response to larger (e.g., more positive) biases than the negative activation bias. Other three-terminal switching devices in which a third terminal controls conductivity between first and second terminals can also be employed for transistor element 102, in various embodiments.

In combination, configuration bit 104 and transistor element 102 can serve as a non-volatile memory device, retaining charge (or the absence of charge) stored at the gate node of transistor element 102 without external power applied to configuration circuit 100. Thus, configuration circuit 100 can mitigate or avoid loss of a stored configuration for the node of the switching block in response to power loss at the switching block. As a result, external non-volatile memory is not required to backup configurations settings, providing a more cost-effective, compact and streamlined device. Similarly, when the switching block is powered on (after being programmed), the configurations settings associated with the programming are immediately applied to the nodes of the switching block via transistor elements 102, achieving much greater startup times than volatile configuration bits. Moreover, configuration bit 104 can have much higher longevity and retention compared with conventional non-volatile memories, resulting in a robust and long-lasting switching block. Still further, configuration bit 104 can be constructed from thin film processing techniques among back-end metal layers, or even within the logic layer of an integrated circuit (e.g., between a substrate and M1 layer), resulting in a very small silicon footprint as well as flexible fabrication options, further mitigating cost overhead. Accordingly, configuration cell 100 can provide a substantial improvement over the state of the art in configuration cells.

Figure 2:
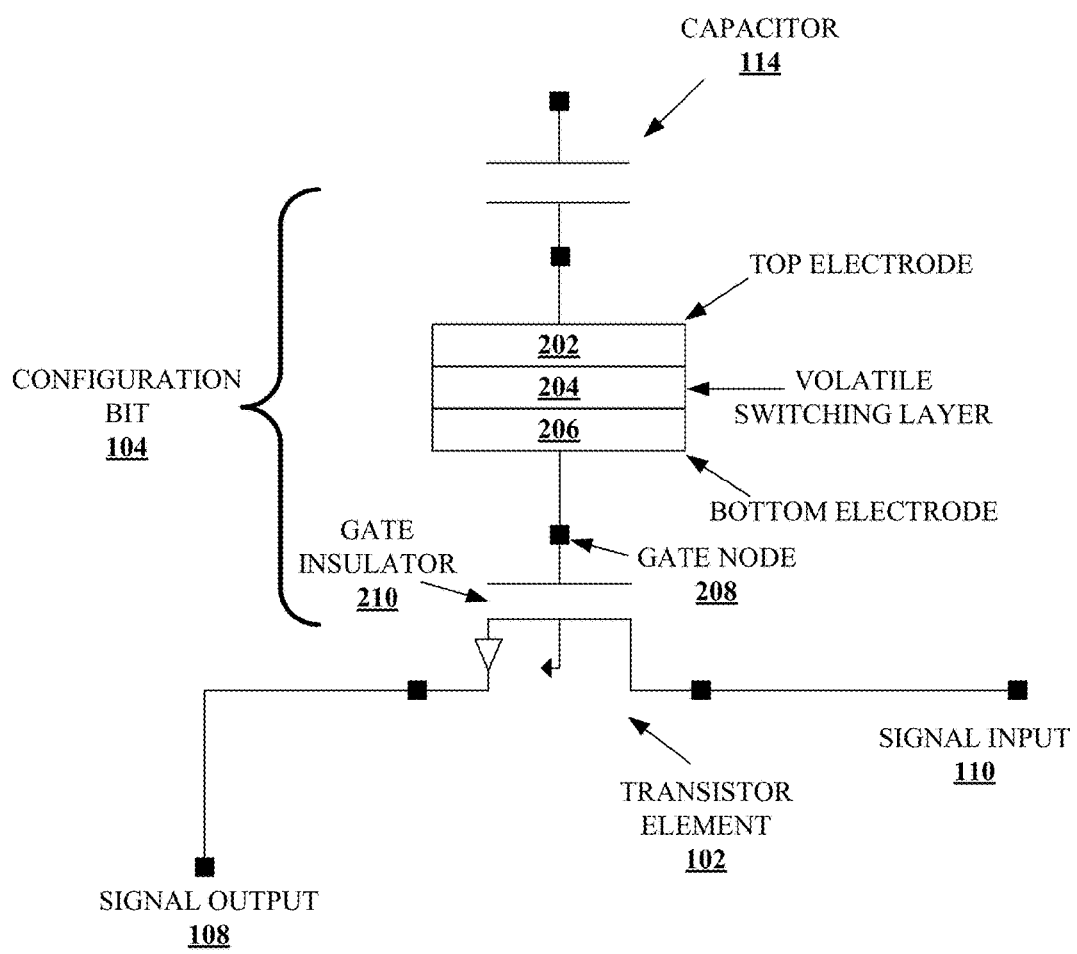
FIG. 2 illustrates a block diagram of a sample non-volatile memory cell employed for the configuration bit of FIG. 1, in an embodiment(s)

FIG. 2 illustrates a schematic diagram of an example circuit 200 for controlling a node of a switching block utilized in a FPGA, in one or more embodiments. Circuit 200 can comprise a configuration bit 104, including transistor element 102 and a capacitor 114. Connected to a gate node 208 of transistor element 102 is a bottom electrode 206 of a volatile resistive switch (e.g., volatile resistive switch 112 of FIG. 1, supra, as one illustrative example). A first surface of a filamentary volatile switching layer 204 is provided adjacent bottom electrode 206, and a top electrode 202 is adjacent to a second surface of the filamentary volatile switching layer 204. Top electrode 202 can comprise conductive particles that are at least in part permeable within filamentary volatile switching layer 204, and that drift through a thickness of filamentary volatile switching layer 204 in response to a positive bias at top electrode 202. Once the positive bias achieves a threshold magnitude, the conductive particles can form an electrically continuous thin filament between top electrode 202 and bottom electrode 206, causing filamentary volatile switching layer 204 to enter a low resistance state. The electrically continuous thin filament can extend the entire thickness of filamentary volatile switching layer 204, or most of the thickness minus a tunneling distance (sufficient to enable tunneling electron flow between an end of the electrically continuous thin filament and bottom electrode 206). Where minimal current flows through volatile switching layer 204 (e.g., because of the electrical resistance and capacitive effect of a gate insulator 210 of transistor element 102 or electrical resistance and capacitive effect of capacitor 114), the electrically continuous thin filament can (at least in part) deform and become electrically non-continuous in response to the positive bias at top electrode 202 dropping below or approximately below the threshold magnitude. In response to the electrically continuous thin filament becoming electrically non-continuous, filamentary volatile switching layer 204 (re)enters a high resistance state.

Further to the above, bottom electrode 206 can comprise second conductive particles that are at least in part permeable within filamentary volatile switching layer 204, and that drift through the thickness of filamentary volatile switching layer 204 in response to a negative bias at top electrode 202 (e.g., a positive bias at bottom electrode 206). Once the negative bias achieves a second threshold magnitude, the second conductive particles can form a second electrically continuous thin filament between bottom electrode 206 and top electrode 202, causing filamentary volatile switching layer 204 to enter the low resistance state (or a second low resistance state, of similar—relative to the high resistance state—but not exactly the same electrical resistance of the low resistance state). The second electrically continuous thin filament between bottom electrode 206 and top electrode 202 can extend the entire thickness of filamentary volatile switching layer 204, or most of the thickness minus the tunneling distance (or a second tunneling distance, also sufficient to enable tunneling electron flow between an end of the second electrically continuous thin filament and top electrode 202). The second electrically continuous thin filament can (at least in part) deform and become electrically non-continuous in response to the negative bias at top electrode 202 dropping below or approximately below the second threshold magnitude. In response to the second electrically continuous thin filament becoming electrically non-continuous, filamentary volatile switching layer 204 (re)enters the high resistance state (or a second high resistance state, of similar—relative to the low resistance state or second low resistance state—but not exactly the same electrical resistance of the high resistance state).

In an embodiment, the conductive particles can be the same elemental metal as the second conductive particles; in another embodiment, the conductive particles can be a different metal from the second conductive particles. In a further embodiment, the threshold magnitude of the positive bias can be the same or approximately the same as the second threshold magnitude of the negative bias; in alternative (or additional) embodiments, the threshold magnitude can be different from the second threshold magnitude.

In one or more embodiments, filamentary volatile switching layer 204 comprises particle-trapping defect sites that conductive particles of top electrode 202 and bottom electrode 206 can occupy to form a conductive filament within volatile switching layer 204. A density of the particle-trapping defect sites within volatile switching layer 204 can be low, facilitating diffusion of the conductive particles and non-continuity of the conductive filament in response to a voltage magnitude at top electrode 202 dropping below the threshold magnitude (or second threshold magnitude). In an embodiment, the defect density of particle-trapping defect sites of volatile switching layer 204 can be low relative to defect density of a non-volatile filamentary resistance switching device (e.g., see U.S. application Ser. No. 14/588,185 commonly assigned to the Assignee of the present application, and incorporated by referenced hereinabove). The low defect density facilitates formation of a thin conductive filament (relative to a non-volatile filamentary resistance switching device) that can quickly become non-continuous in response to the diffusion of conductive particles below the threshold magnitude (or second threshold magnitude).

While filamentary volatile switching layer 204 is in a high resistance state, the volatile resistive switch can behave electrically as a capacitor. A circuit diagram of circuit 200 can be represented by three capacitors electrically in series, including capacitor 114 as a first of the three capacitors, the volatile resistive switch (in the high resistance state) as a second of the three capacitors, and gate insulator 210 of transistor element 102 as a third of the three capacitors. Accordingly, a voltage applied across the electrically series combination of capacitor 114, the volatile resistive switch and transistor element 102 is divided across respective ones of the three capacitors in proportion to their respective capacitances, as is understood in the art. With different words, a voltage dropped across capacitor 114, a second voltage dropped across the volatile resistive switch and a third voltage dropped across gate insulator 210 can each be respective fractions of the voltage applied across the electrically series combination. The respective fractions can be in proportion to respective ratios of a first capacitance of capacitor 114, a second capacitance of the volatile resistive switch and a third capacitance of the gate insulator, and a sum of these three capacitances.

While filamentary volatile switching layer 204 is in a low resistance state, the volatile resistive switch can behave electrically as a short. In response to a voltage across the volatile resistive switch exceeding a threshold magnitude and the volatile resistive switch changing from the high resistance state to the low resistance state, voltages dropped across capacitor 114 and gate insulator 210 change (generally increase in magnitude) such that the first voltage and the third voltage approximately sum to the voltage applied across the electrically series combination (the second voltage going to zero or substantially zero). As a result, charge at gate node 208 increases in response to volatile resistive switching changing to the low resistance state. When the voltage across the volatile resistive switch drops below the threshold magnitude, volatile resistive switch reverts to the high resistance state, trapping some charge accumulated at gate node 208. This trapped charge can be sufficient to activate transistor element 102, even when the voltage applied across the series combination of capacitor 114, the volatile resistive switch and gate insulator 210 is zero. Accordingly, in the absence of external power, the charge at gate node 218 can remain at a magnitude sufficient to activate transistor element 102. Thus, configuration bit 104 can operate as a non-volatile memory with respect to the activation/deactivation of transistor element 102 and conductivity/resistivity, respectively, of signal input 110 and signal output 108.

Figure 3:
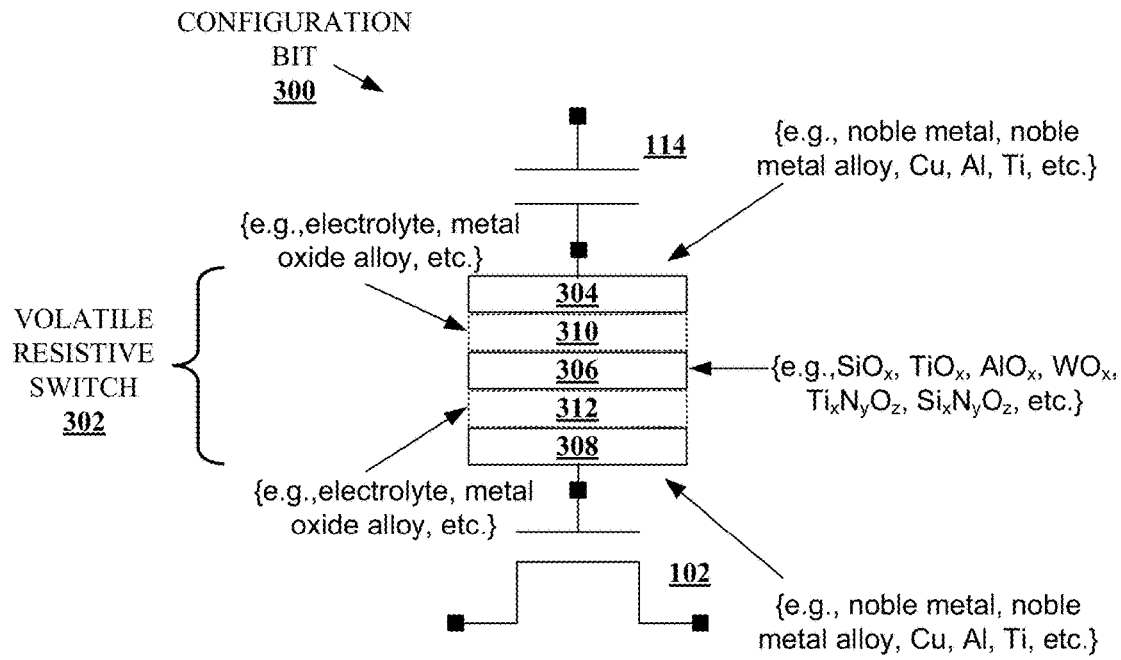
FIG. 3 illustrates a block diagram of a sample non-volatile memory cell for a configuration bit according to a further embodiment.

Turning now to FIG. 3, there is depicted an example configuration bit 300 for a switching block of an FPGA according to additional embodiments of the present disclosure. Configuration bit 300 can comprise a capacitor 114, having a first (e.g., top) terminal and a second (e.g., bottom) terminal, the first terminal connected to a signal input, such as a voltage input, current input, etc. The second terminal can be connected to top electrode 304 of a volatile resistive switch 302, which further comprises a filamentary volatile switching layer 306 and a bottom electrode 308. Top electrode 304 can provide a first group of current-carrying particles, in response to a bias at top electrode 304, sufficient to form a conductive filament through filamentary volatile switching layer 306, which can be at least weakly permeable to the first group of current-carrying particles (weak permeability facilitating reliable dispersion of conductive ions or deformation of a conductive filament formed within filamentary volatile switching layer 306 below a threshold voltage magnitude, for instance). Similarly, bottom electrode 308 can provide a second group of current-carrying particles, in response to a reverse polarity bias at top electrode 304 (or a bias at bottom electrode 308), sufficient to form a second conductive filament through filamentary volatile switching layer 306, which can also be at least weakly permeable to the second group of current-carrying particles. Bottom electrode 208 is connected to a gate of a transistor element 102, as illustrated, and the source and drain of transistor element 102 can be connected to an input and output, respectively, of a switching block.

Top electrode 304 and bottom electrode 308 can comprise the same material in an embodiment; in other embodiments, top electrode 304 and bottom electrode 308 can comprise different materials. In various embodiments, a material(s) selected for top electrode 304 or bottom electrode 308 can include a noble metal, a suitable noble metal alloy, a fast diffusing metal (e.g., Cu, Al, Ti, Co, Ni, Ag, etc.) or a suitable alloy of the fast diffusing metal with a nonmetal (which can include metalloids or other non full metals, e.g., a metal and Si alloy, and can include conventional nonmetals, e.g., a metal and N alloy, etc.), a suitable compound of the foregoing (e.g., a metal-nonmetal compound, a noble metal nitride, AN, CuN, TiN, AgSi, a suitable noble metal oxide, etc.), or the like, or a suitable combination of the foregoing. In various embodiments, top electrode 304 or bottom electrode 308 can be an active metal, whereas in other embodiments top electrode 304 or bottom electrode 308 can be an integrated circuit wiring metal (e.g., W, Al, Cu, TiN, TiW, TaN, WN, and so forth).

Filamentary volatile switching layer 306 can comprise a non-stoichiometric material, in various embodiments. In at least some embodiments, filamentary volatile switching layer 306 can comprise a material(s) including a metal oxide, a metal nitride, a metal oxynitride, $SiO_x$, $TiO_x$, $AlO_x$, $HfO_x$, $TaO_x$, $NbO_x$, $WO_x$, $Ti_xN_yO_z$, $Si_xN_yO_z$, or the like, or a suitable combination of the foregoing, where x, y and z are suitable non-stoichiometric numbers and can have different values for different compounds (e.g., x, y or z can have one non-stoichiometric value for a suitable $SiO_x$ compound, and another non-stoichiometric value for a suitable $AlO_x$ compound, and so forth). In some embodiments, filamentary volatile switching layer 306 can be a chalcogenide or a solid-electrolyte material containing one or more of Ge, Sb, S, Te. In yet another embodiment, the material utilized for filamentary volatile switching layer 306 can comprise a stack of a plurality of the above mentioned materials (e.g. SiOx/GeTe, TiOx/AlOx, etc.).

In further embodiments, a stoichiometric value(s) of material utilized for filamentary volatile switching layer 306 can be provided at a target value. For instance, a stoichiometric value for 'x' for a SiOx filamentary volatile switching layer 306 can be between about 0.5 and about 2. In at least one embodiment, the stoichiometric value can be selected to achieve a target width for a conductive path (e.g., filament) through filamentary volatile switching layer 306. In some embodiments, increasing stoichiometric value(s) of the material utilized for filamentary volatile switching layer 306 can reduce defect density of filamentary volatile switching layer 306 (e.g., density of dangling bonds, density of particle voids, and so forth), and the stoichiometric value can be selected to achieve a target defect density to provide the target width for the conductive path. In at least one disclosed embodiment, filamentary volatile switching layer 306 thickness and stoichiometric value can be respectively selected to achieve a target trade-off between maximum threshold voltage and maximum defect density. In at least one embodiment of the present disclosure, filamentary volatile switching layer 306 can be doped with a metal(s) during fabrication, to facilitate metal ion injection from the top or bottom electrode.

In one or more additional embodiments, volatile resistive switch 302 can optionally comprise a first ion conductor layer 310. In other embodiments, volatile resistive switch 302 can optionally comprise a second ion conductor layer 312. In some embodiments, volatile resistive switch 302 can comprise both first ion conductor layer 304 and second ion conductor layer 312. In alternative or additional embodiments, top electrode 304, filamentary volatile switching layer 306 and bottom electrode 308 can be substantially similar to the similarly named layers of FIG. 2, supra, however the subject disclosure is not so limited, and different materials or characteristics can be associated with filamentary volatile switching layer 306—selected for suitability when filamentary volatile switching layer 306 is adjacent to first ion conductor layer 310, to second ion conductor layer 312, or to both first ion conductor layer 310 and to second ion conductor layer 312—within the scope of the present disclosure.

First ion conductor layer 310 or second ion conductor layer 312 can comprise a solid electrolyte (e.g., Ag—Ge—S, Cu—Ge—S, Ag—Ge—Te, Cu—Ge—Te, GeSb, etc.), a metal-oxide alloy (e.g., $AgSiO_2$, $CuAl2Ox$, and so forth). In some embodiments, ion conductor layer 310 can be present within volatile resistive switch 302 depend at least in part on a diffusivity metric of ions of top electrode 402. In another embodiment, presence of second ion conductor layer 312 can depend at least in part on a diffusivity metric of ions of bottom electrode 410. In further embodiments, first ion conductor layer 310 or second ion conductor layer 312 can be selected to yield faster ion generation (hence faster switching or lower voltage switching) for filamentary volatile switching layer 306 as compared with top electrode 304 alone or bottom electrode 308 alone.

Figure 4:
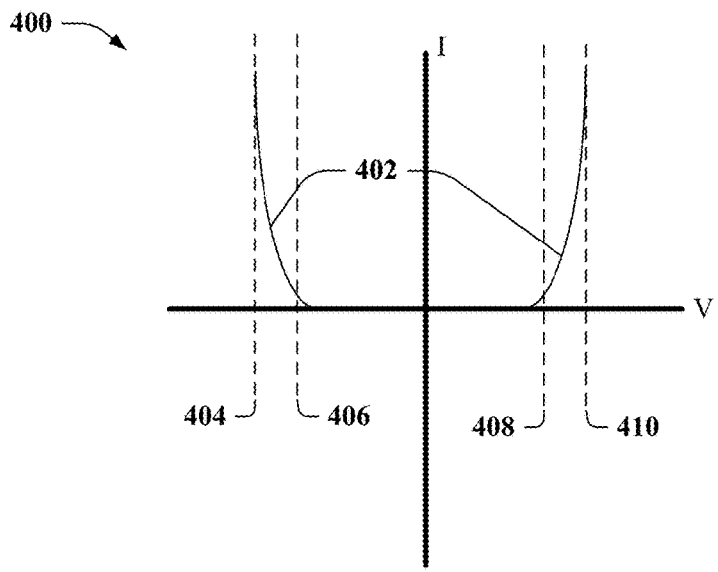
FIG. 4 depicts a diagram of an example I-V response for a filamentary volatile switch employed for a non-volatile memory, in an embodiment.

FIG. 4 depicts a graph 400 of an I-V response 402 for a filamentary volatile switching device, according to various embodiments. Note that the I-V response 402 is for the volatile switching device alone, and not connected to a capacitor 114 or transistor element 102 as provided in FIGS. 1, 2 and 3. I-V response 402 is provided for a range of positive and negative voltages. The x-axis of graph 400 illustrates voltage, and the y-axis of graph 400 shows current. In between the negative and positive voltages 406 and 408, very little current is conducted by the filamentary volatile switching device, and the filamentary volatile switching device effectively behaves like a high resistance resistor, or even a capacitor. In the range of negative voltages 404 and 406 as well as positive voltages 408 and 410, the filamentary volatile switching device very quickly transitions to a low resistance state. The ratio of resistances between the high resistance state and the low resistance state can be in the vicinity of $1\times10^7:1$ to $1\times10^{10}:1$, in at least some disclosed embodiments, or higher (or lower) in other embodiments.

In an embodiment, the selector device can begin to transition from a high resistance state to a low resistance state at about −1.7V and about +1.7V (406 and 408 respectively). The transition can be complete by about −2V and about +2V (404 and 410 respectively). In other embodiments, the voltage threshold 406/408 can begin at ±1.5V and the selector device can be fully transitioned into the low resistance state by ±1.8V (404/410). In still other embodiments, negative voltages 404/406 and positive voltages 408/410 can have other respective ranges of voltage values. The magnitudes of the thresholds need not be symmetric (e.g. −1.3 volts and +1.5 volts, and so forth).

Figure 5A:
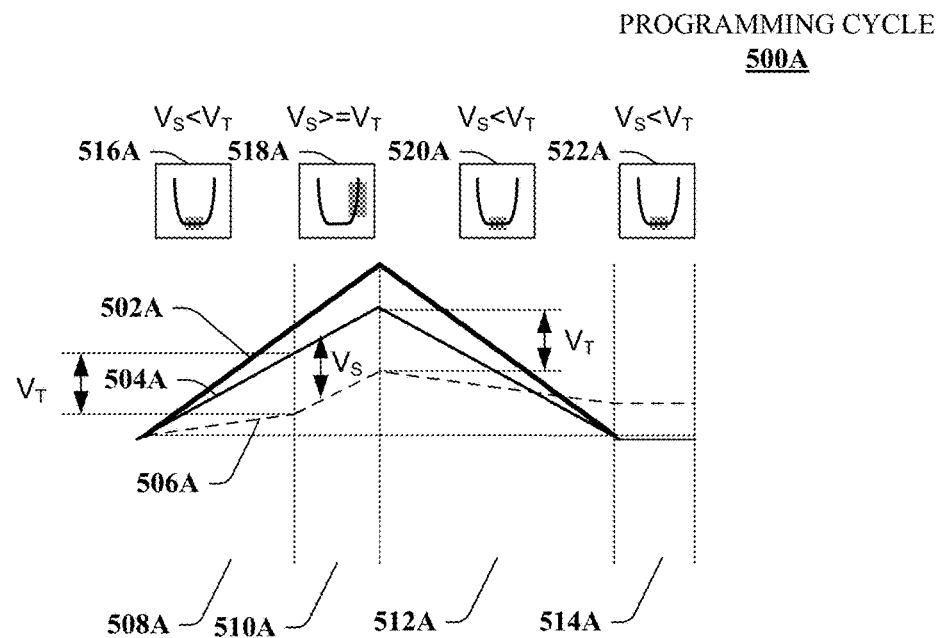
FIGS. 5A and 5B illustrate example current-voltage responses for a configuration bit in response to time-varying input of a disclosed programming circuit.
Figure 5B:
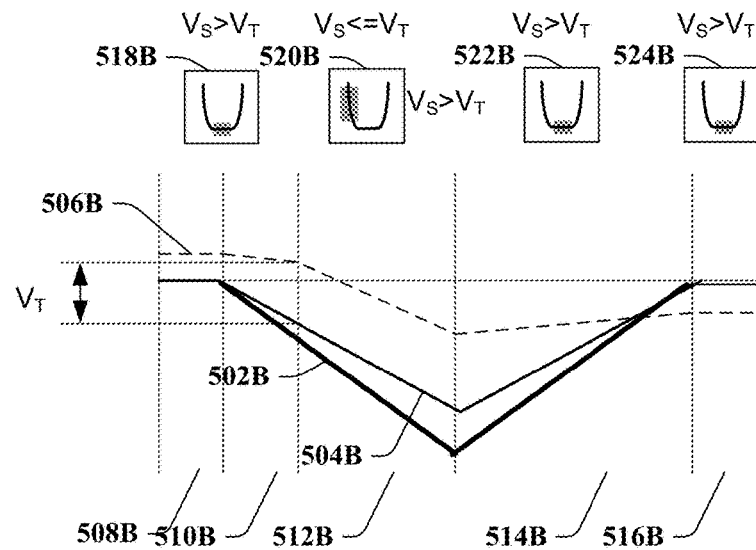

Turning now to FIGS. 5A and 5B, illustrated are a programming cycle diagram 500A and an erase cycle diagram 500B for an example non-volatile memory cell in accordance with various aspects described herein. Programming cycle diagram 500A shows a voltage input to a disclosed configuration bit (e.g., into a first terminal of capacitor 114, or into top electrode 202 of a volatile resistive switch for a configuration bit without capacitor 114) and voltages dropped by components of the configuration bit in response to the voltage input. For a programming cycle, the input voltage is referred to as program signal 502A and is illustrated by the bold line in programming cycle diagram 500A. In response to program signal 502A is a switch voltage 504A at top electrode 202 of the volatile resistive switch (e.g., 112, 302), depicted by the solid line in programming cycle diagram 500A, and a gate voltage 506A at a gate node of a transistor element (e.g., 208) illustrated by a dashed line in programming cycle diagram 500A. The vertical distance between switch voltage 504A and gate voltage 506A is $V_S$ and represents the voltage dropped across the volatile resistive switch. During a first time period 508A, as the program signal 502A increases and the voltages at each of the elements increase at respective rates, the relative increases in voltage are based on the respective capacitive ratios of the 3 elements (e.g., capacitor 114, volatile resistive switch 302 and gate insulator 310). During first time period 508A, program signal 502A increases at a first rate, while switch voltage 504A increases at a second rate, slower than the first rate, and gate voltage 506A increases at a third rate, slower than the second rate. Also, during first time period 508A, the volatile resistive switch is in a high resistance state shown by I-V graph 516A (with current on a vertical axis and voltage on a horizontal axis), conducting very little current as depicted by the shaded bottom portion of I-V graph 516A where current is near to zero. During first time period 508A, $V_S<V_T$, where $V_S$ is the voltage dropped across the volatile resistive switch and $V_T$ is the positive threshold voltage associated with the volatile resistive switch.

During time period 510A however, the program signal 502A has increased to a transition voltage such that the voltage across the volatile resistive switch, $V_S$, begins to exceed $V_T$. In such a situation, the volatile resistive switch transitions into a low resistance state, as shown in the shaded portion of I-V graph 518A (where the rapidly increasing current on the right-side vertical line is shaded). In various embodiments, $V_S$ is approximately clamped to $V_T$. In one embodiment, the transition occurs when the difference between the switch voltage 504A and gate voltage 506A, e.g., the voltage across the volatile resistive switch, exceeds a positive threshold voltage (e.g. about 1.5 to about 1.7 volts.) In some embodiments, program signal 502A applies a voltage exceeding about 3.2 volts, for the voltage across the volatile resistive switch $V_S$ to exceed the positive threshold voltage $V_T$. It should be understood that in other embodiments, the voltage applied by program signal 502A to achieve the threshold voltage across the volatile resistive switch will vary depending upon the design parameters and characteristics of the capacitor structure, the volatile resistive switch, and the MOS transistor.

In various embodiments, within time period 510A, the volatile resistive switch essentially becomes a conductor (as a result of filament formation, discussed above), and the gate voltage 506A increases at the gate of the transistor element at a faster rate (e.g., a fourth rate, greater than the third rate) than it did within time period 508A. During this time period 510A, the second rate of increase of switch voltage 504A can remain approximately the same (as time period 508A), or can decrease slightly (not shown in FIG. 5A due to the scale of the change) since the volatile resistive switch does not act as a capacitor in the conductive state, thus changing the capacitive ratio(s) of the circuit. However, the capacity to switch to the high resistance state at below the threshold voltage maintains the voltage across the volatile resistive switch at approximately the threshold voltage while program signal 502A remains above the transition voltage. During time period 510A, the third rate of voltage increase at gate voltage 506A approximately matches the second rate of voltage increase of switch voltage 504A. For time period 510A, $V_S$ remains approximately clamped at $V_T$. In various embodiments, during time period 510A, positive electric charge is conducted across the volatile resistive switch and stored on the gate node of the transistor element.

During time period 512A, the program signal 502A applied by the voltage source has peaked and decreases slowly, and the program signal 502A, switch voltage 504A and gate voltage 506A ramp downward in magnitude. The volatile resistive switch returns to a high resistance state in response to program signal 502A dropping below the transition voltage, as shown in I-V graphs 520A and 522A. With volatile resistive switch in the high resistance state, the difference between switch voltage 504A and gate voltage 506A, $V_S$, can drop below $V_T$. In some embodiments, a negative slope or rate of decrease of program signal 502A, switch voltage 504A or gate voltage 506A may be different from the analogous slope or rates of increase within time periods 508A and 510A. The relative decreases in voltage within time period 512A are once again based on capacitive coupling ratios of capacitor 114, the volatile resistive switch and gate insulator 210, following transition of the volatile resistive switch to the high resistance state. At an end of time period 512A, a net positive charge (and therefore voltage) accumulated at the gate node of the transistor element remains at time period 514A, even though the program signal 502A and switch voltage 504A both reach zero voltage. In time period 514A in various embodiments, the net positive charge can be greater than an activation voltage of the transistor element. In an embodiment, the positive charge can provide roughly 0.75V at the gate of the transistor element.

Turning to FIG. 5B, illustrated is an erase cycle diagram 500B for a configuration bit in accordance with various aspects described herein. Erase cycle diagram 500B shows an erase voltage 502B illustrated by a bold line, applied at the first terminal of a capacitor of the configuration bit (or, e.g., the volatile resistive switch), a switch voltage 504B (solid line) at a first terminal of the volatile resistive switch, and a gate voltage 506B at a gate node of a transistor element of the configuration bit. The vertical distance in time period 512B between gate voltage 506B and switch voltage 504B is equal to the (negative) threshold voltage $V_T$ at which the volatile resistive switch changes state, while $V_S$ is the voltage dropped across the volatile resistive switch. Within time periods 508B and 510B, $V_S>V_T$ (in the sense that $V_S$ has a lower negative magnitude). During time period 508B, there is no voltage applied by the voltage source and thus erase signal 502B and switch voltage 504B are zero, while gate voltage 506B retains the voltage acquired during a previous program phase (e.g., FIG. 5A). Since the volatile resistive switch is in a high resistance state as shown in I-V graph 518B, charge accumulated at the gate node 208 will remain due to the high resistance of the volatile resistive switch (and gate insulator 210) resisting leakage of charge away from gate node 208. In time period 510B however, as the negative voltage gains magnitude, voltages across the capacitor 114, volatile resistive switch and the gate insulator 210 are determined by their respective capacitive ratios, similar to the erase cycle diagram 500A, supra.

In phase 512B however, the voltage across the volatile resistive switch ($V_S$) has achieved a magnitude equal to the voltage threshold $V_T$ and the volatile resistive switch transitions to a low resistance state as shown in I-V graph 520B. In one embodiment, $V_S$ is approximately clamped to $V_T$ while the volatile resistive switch is in the low resistance state. In alternative or additional embodiments, the transition occurs when the difference between the switch voltage 504B and the gate voltage 506B (e.g. the voltage dropped across the volatile resistive switch) exceeds the negative threshold voltage (e.g., about -1.5 to about -1.7 volts in some embodiments, though other negative voltage ranges are contemplated in other embodiments.) In some embodiments, erase signal 502B applies a voltage exceeding about -3.2 volts, for the voltage across the volatile resistive switch $V_S$ to exceed the negative threshold voltage $V_T$. It should be understood that in other embodiments, the voltage applied by erase signal 502B—to achieve the threshold voltage across the volatile resistive switch—will vary depending upon the design parameters and characteristics of the capacitor structure, the volatile resistive switch, and the transistor element.

In time period 512B, since the capacitive ratio of the circuit changes due to the transition of the volatile resistive switch (as a result of transition to the low resistance state and the volatile resistive switch no longer functioning as a capacitor, discussed above), the rate of change of the switch voltage 504B can remain the same or decrease slightly (though not enough to cause the volatile resistive switch to transition to the high resistance state). The slight decrease in voltage, if present, is not shown in FIG. 5B due to the small scale of such a change, if any. The gate voltage 506B begins to drop at the same/similar rate as the switch voltage 504B until time period 514B, during which the negative voltage begins to increase, and the volatile resistive switch transitions to the high resistance state as shown in I-V graph 522B. More particularly, as the erase signal 502B increases, the voltage $V_S$ drops below about $V_T$, and thus the volatile resistive switch enters the high resistance state, and again functions as a capacitor in series with capacitor 114 and the gate insulator 210. The erase signal 502B and switch voltage 504B continue to decrease to zero. Eventually, by time period 516B, a negative gate voltage 506B remains, whereas erase signal 502B and switch voltage 504B have returned to zero, and thus the volatile resistive switch remains in the high resistance state (e.g., see I-V graph 524B). In an embodiment, a voltage of roughly −0.75V can remain at the gate node 208.

Figure 6:
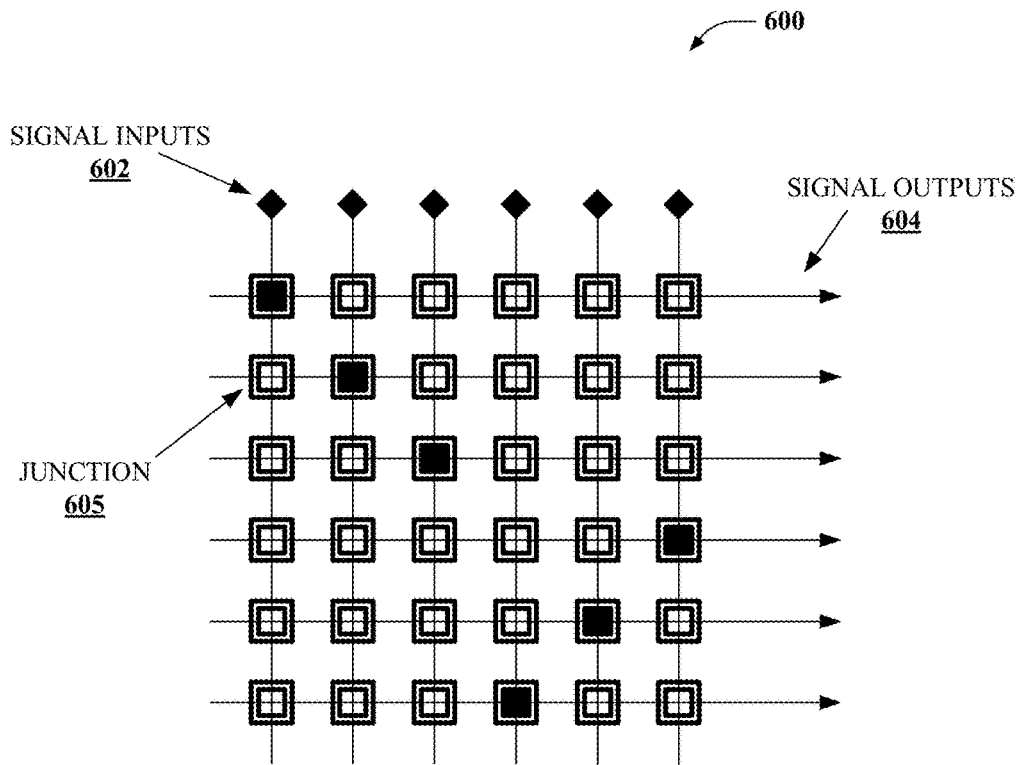
FIG. 6 depicts a sample switching block routing array comprising multiple nodes and example configuration bit for respective nodes, in an embodiment(s)
Figure 6:
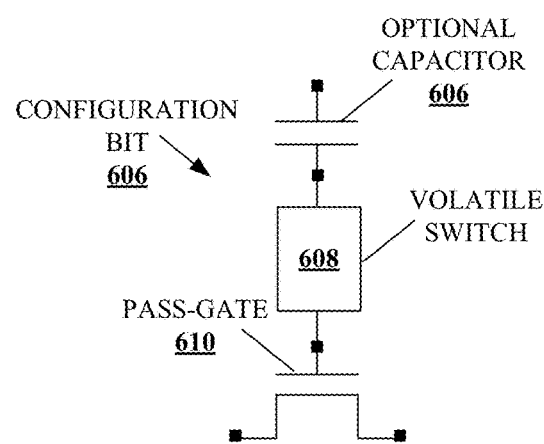

FIG. 6 illustrates a diagram of an example programmable switching block 600 for a FPGA in an embodiment of the present disclosure. According to particular aspects, nodes 605 (also referred to as a junction) of programmable switching block 600 can be programmed via disclosed configuration bits. In at least one such aspect, the configuration bits can be substantially similar to configuration bit 104, configuration bit 300, or other suitable configuration bit described herein, known in the art or made known to one of ordinary skill in the art by way of the context provided by the present disclosure.

Programmable switching block 600 can comprise a set of signal inputs 602 intersecting a set of signal outputs 604 of programmable switching block 600. Moreover, a configuration bit is formed at respective junctions, or nodes 605, of signal input lines 602 and signal output lines 604. In at least one aspect, the configuration bit can correspond with the configuration bit schematic 606, having an optional capacitor 608, a volatile resistive switch 610 and a transistor element 612.

The configuration bit, in an activated or programmed state, electrically connects a signal input line and a signal output line at one node 605, and in a deactivated or erased state, electrically isolates the signal input line and the signal output line at the node 605. A connected junction is a programmed node 605, depicted by a black square at the respective junction of programmable switching block 600. A disconnected junction is an open node 605, depicted by a white square at the respective junction of programmable switching block 600.

It should be appreciated that respective nodes 605 of programmable switching block 600 can be reprogrammed (e.g., by changing activation/deactivation states of configuration cells positioned at the respective nodes 605). Thus, although a particular program state is depicted by the connected junctions and open junctions of FIG. 6, the depicted example is only one possible program state for programmable switching block 600. Further, it should be understood that programmable switching block 600 can be reprogrammed in the field, for FPGA applications.

In addition to the foregoing, in at least some aspects of the subject disclosure, programmable switching block 600 can have bidirectional signal inputs 602 and signal outputs 604. Said differently, one (or more) of signal outputs 604 can initiate a signal, which can be received at a corresponding one (or more) of signal inputs 602. As described herein, whether this signal is received or not received at the signal input is determined from an activation/deactivation state of a transistor element 612. If the transistor element 612 is activated, the signal can be received at the corresponding signal input; otherwise, the signal is not received. Therefore, although programmable switching block 600 identifies respective signal inputs 602 and signal inputs 604, it should be appreciated that in the above-described aspects signal inputs 602 and signal outputs 604 can be renamed signal contacts having a first end and a second end, that can be employed for either transmitting or receiving a signal, or both, under suitable conditions (e.g., signals of different frequency, phase, or other suitable distinguishing characteristic could be transmitted concurrently at the first end and the second end, and received at the corresponding other end second end and first end, respectively).

The aforementioned diagrams have been described with respect to interaction between several components of a configuration bit for a switching block, or arrays of such configuration bits. It should be appreciated that in some suitable alternative aspects of the subject disclosure, such diagrams can include those components specified therein, some of the specified components, or additional components. For example, a switching block architecture could include a combination of programming circuit 106, configuration bit 300, transistor element 102 with gate node 208 and gate insulator 210, signal input 108 and signal output 110. Sub-components can also be implemented as electrically connected to other sub-components rather than included within a parent entity. Additionally, it is noted that one or more disclosed processes can be combined into a single process providing aggregate functionality. For instance, a read process or a write process can comprise an inhibit process, or the like, or vice versa, to facilitate selective programming or erasing of subsets of configuration bits of an array. In addition, it should be appreciated that respective rows of disclosed switching blocks can be programmed or erased in groups (e.g., multiple rows programmed or erased concurrently) or individually. Components of the disclosed architectures can also interact with one or more other components not specifically described herein but known by those of skill in the art.

Figure 7:
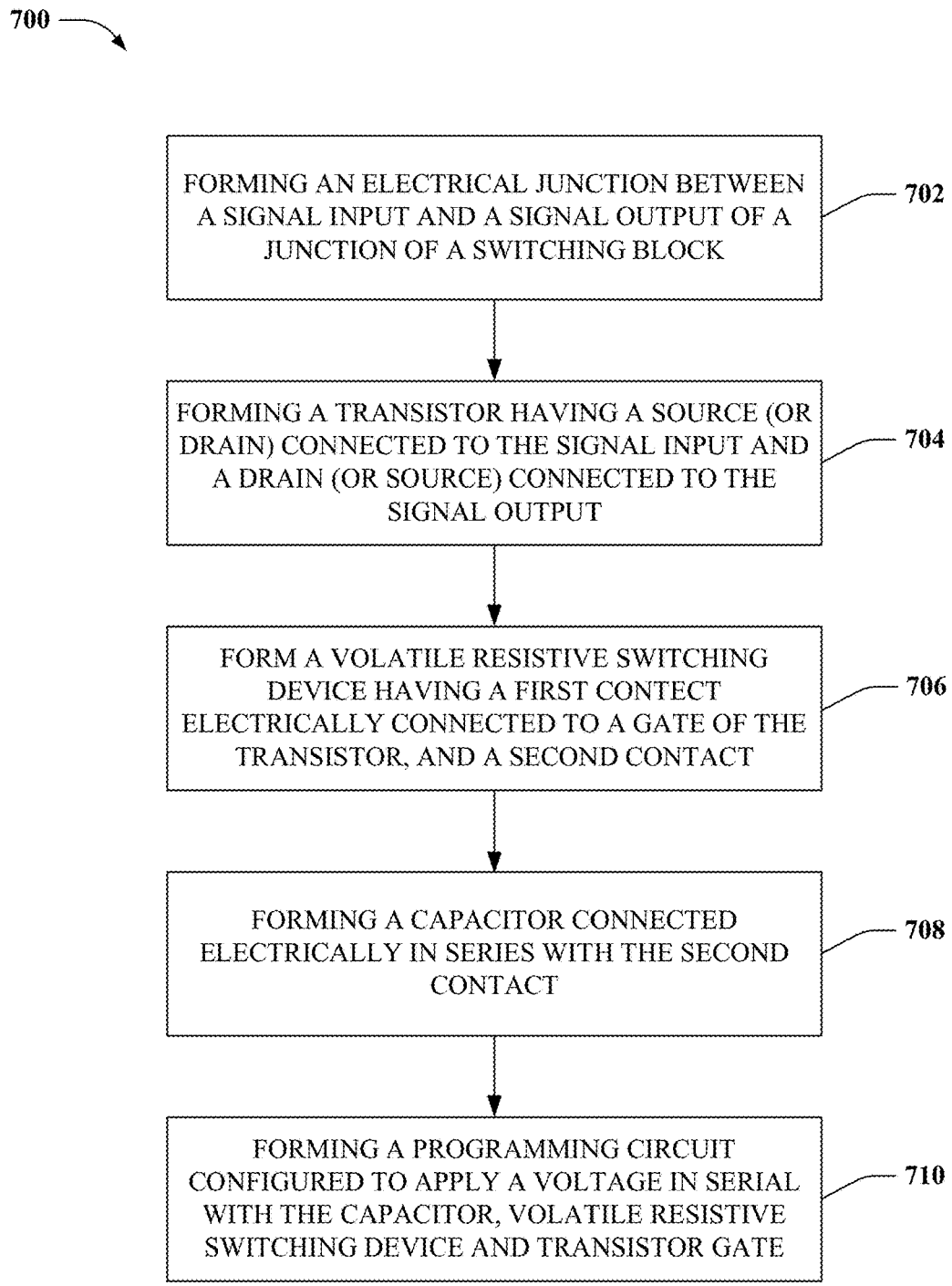
FIG. 7 illustrates a flowchart of a sample method for fabricating a configuration bit in an example embodiment.
Figure 8:
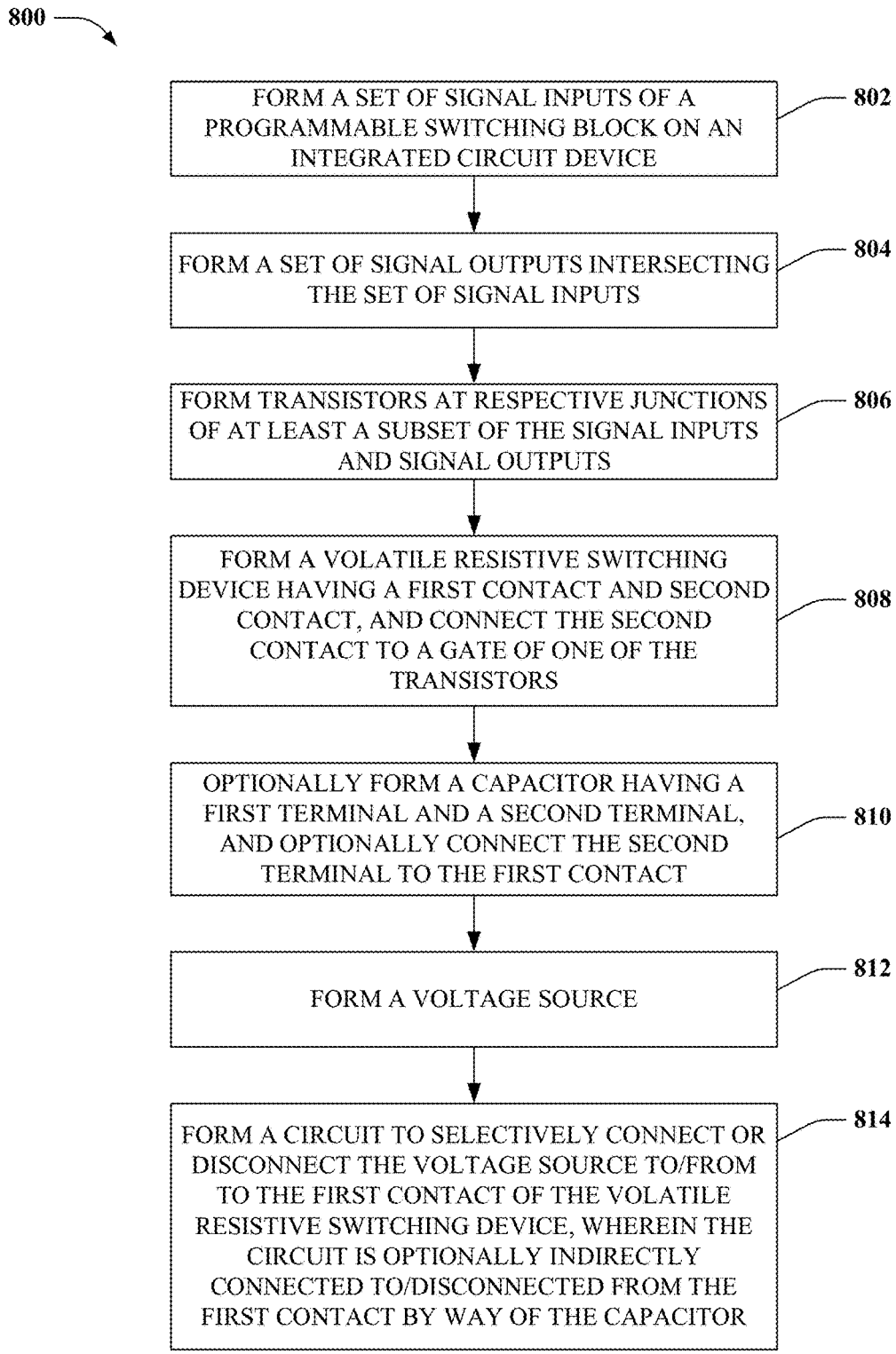
FIG. 8 depicts a flowchart of a sample method for fabricating a field programming gate array in one or more additional embodiments.

In view of the exemplary diagrams described supra, process methods that can be implemented in accordance with the disclosed subject matter will be better appreciated with reference to the flow charts of FIGS. 7 and 8. While for purposes of simplicity of explanation, the methods of FIGS. 7 and 8 are shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks may be required to implement the methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any suitable computer-readable device, device in conjunction with a carrier, storage medium, or the like, or a suitable combination thereof.

FIG. 7 depicts a flowchart of a sample method 700 for fabricating a configuration bit of a programmable switching block circuit, in various disclosed embodiments. At 702, method 700 can comprise forming an electrical junction between a signal input and a signal output of a junction of a switching block. At 704, method 700 can comprise forming a transistor having a source (or drain) connected to the signal input and a drain (or source) connected to the signal output. At 706, method 700 can comprise forming a volatile resistive switching device having a first contact electrically connected to a gate of the transistor, and a second contact. At 708, method 700 can comprise forming a capacitor connected electrically in series with the second contact of the transistor. At 710, method 700 can comprise forming a programming circuit configured to apply a voltage in serial with the capacitor, volatile resistive switching device and gate of the transistor.

FIG. 8 illustrates a flowchart of a sample method 800 of forming a programmable switching block according to additional embodiments of the present disclosure. At 802, method 800 can comprise forming a set of signal inputs of the programmable switching block on an integrated circuit device. At 804, method 800 can comprise forming a set of signal outputs intersecting the set of signal inputs. At 806, method 800 can comprise forming transistors at respective junctions of at least a subset of the signal inputs and signal outputs. Further, at 808, method 800 can comprise forming a volatile resistive switching device having a first contact and second contact, and connecting the second contact to a gate of one of the transistors. At 810, method 800 can comprise optionally forming a capacitor having a first terminal and a second terminal, and optionally connecting the second terminal to the first contact of the volatile resistive switching device. At 812, method 800 can comprise forming a voltage source. At 814, method 800 can comprise forming a circuit to selectively connect or disconnect the voltage source to/from the first contact of the volatile resistive switching device, wherein the circuit is optionally indirectly connected to/disconnected from the first contact by way of the capacitor.

Figure 9:
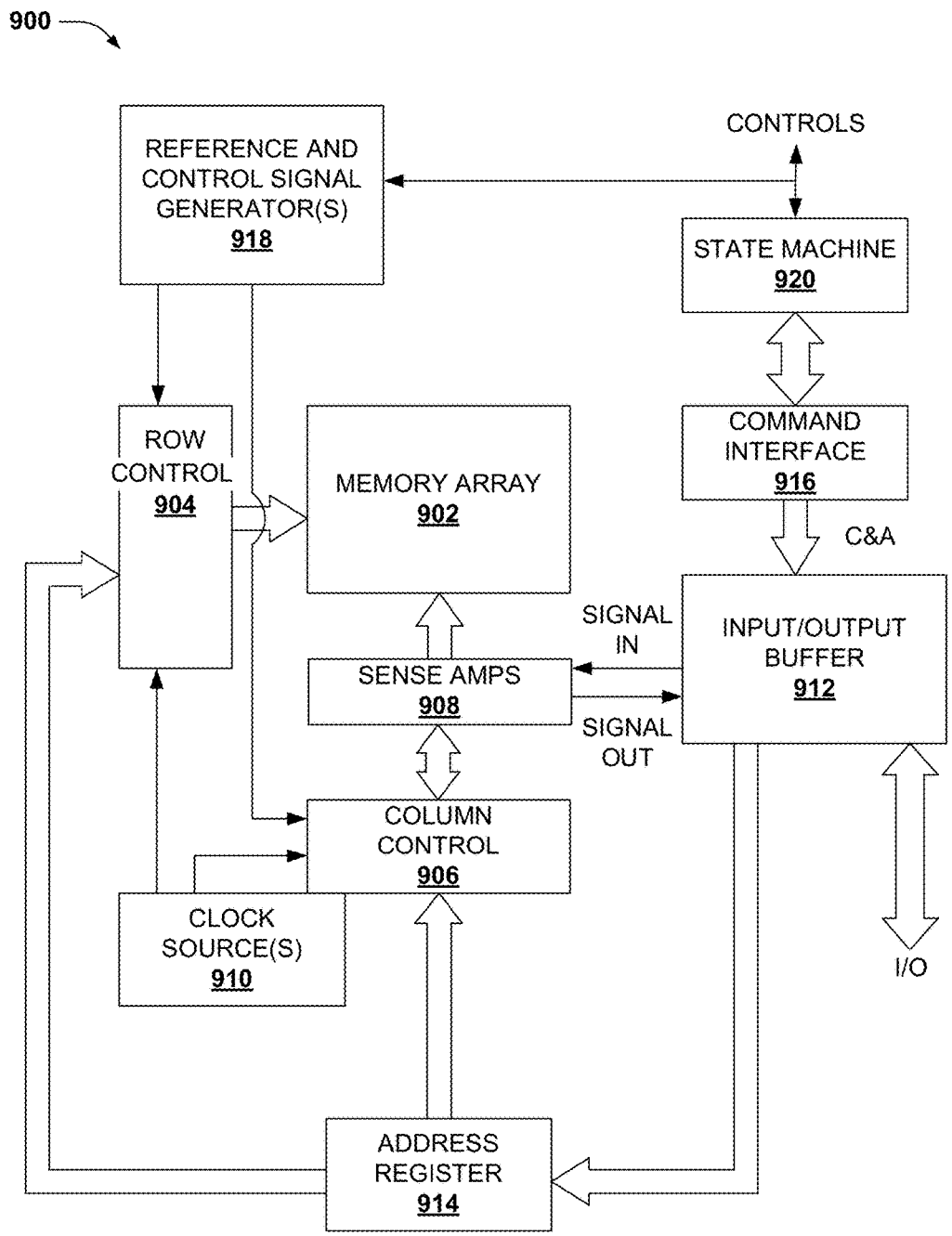
FIG. 9 illustrates a block diagram of a sample operating environment for facilitating implementation of one or more aspects disclosed herein.

FIG. 9 illustrates a block diagram of an example operating and control environment 900 for a memory array 902 of a memory cell array according to aspects of the subject disclosure. In at least one aspect of the subject disclosure, memory array 902 can comprise memory selected from a variety of memory cell technologies. In at least one embodiment, memory array 902 can comprise a two-terminal memory technology, arranged in a compact two or three dimensional architecture. Suitable two-terminal memory technologies can include resistive-switching memory, conductive-bridging memory, phase-change memory, organic memory, magneto-resistive memory, or the like, or a suitable combination of the foregoing.

A column controller 906 and sense amps 908 can be formed adjacent to memory array 902. Moreover, column controller 906 can be configured to activate (or identify for activation) a subset of bit lines of memory array 902. Column controller 906 can utilize a control signal provided by a reference and control signal generator(s) 918 to activate, as well as operate upon, respective ones of the subset of bitlines, applying suitable program, erase or read voltages to those bitlines. Non-activated bitlines can be kept at an inhibit voltage (also applied by reference and control signal generator(s) 918), to mitigate or avoid bit-disturb effects on these non-activated bitlines.

In addition, operating and control environment 900 can comprise a row controller 904. Row controller 904 can be formed adjacent to and electrically connected with word lines of memory array 902. Also utilizing control signals of reference and control signal generator(s) 918, row controller 904 can select particular rows of memory cells with a suitable selection voltage. Moreover, row controller 904 can facilitate program, erase or read operations by applying suitable voltages at selected word lines.

Sense amps 908 can read data from, or write data to the activated memory cells of memory array 902, which are selected by column control 906 and row control 904. Data read out from memory array 902 can be provided to an input/output buffer 912. Likewise, data to be written to memory array 902 can be received from the input/output buffer 912 and written to the activated memory cells of memory array 902.

A clock source(s) 908 can provide respective clock pulses to facilitate timing for read, write, and program operations of row controller 904 and column controller 906. Clock source(s) 908 can further facilitate selection of word lines or bit lines in response to external or internal commands received by operating and control environment 900. Input/output buffer 912 can comprise a command and address input, as well as a bidirectional data input and output. Instructions are provided over the command and address input, and the data to be written to memory array 902 as well as data read from memory array 902 is conveyed on the bidirectional data input and output, facilitating connection to an external host apparatus, such as a computer or other processing device (not depicted, but see e.g., computer 1002 of FIG. 10, infra).

Input/output buffer 912 can be configured to receive write data, receive an erase instruction, receive a status or maintenance instruction, output readout data, output status information, and receive address data and command data, as well as address data for respective instructions. Address data can be transferred to row controller 904 and column controller 906 by an address register 910. In addition, input data is transmitted to memory array 902 via signal input lines between sense amps 908 and input/output buffer 912, and output data is received from memory array 902 via signal output lines from sense amps 908 to input/output buffer 912. Input data can be received from the host apparatus, and output data can be delivered to the host apparatus via the I/O bus.

Commands received from the host apparatus can be provided to a command interface 916. Command interface 916 can be configured to receive external control signals from the host apparatus, and determine whether data input to the input/output buffer 1612 is write data, a command, or an address. Input commands can be transferred to a state machine 920.

State machine 920 can be configured to manage programming and reprogramming of memory array 902 (as well as other memory banks of a multi-bank memory array). Instructions provided to state machine 920 are implemented according to control logic configurations, enabling state machine to manage read, write, erase, data input, data output, and other functionality associated with memory cell array 902. In some aspects, state machine 920 can send and receive acknowledgments and negative acknowledgments regarding successful receipt or execution of various commands. In further embodiments, state machine 920 can decode and implement status-related commands, decode and implement configuration commands, and so on.

To implement read, write, erase, input, output, etc., functionality, state machine 920 can control clock source(s) 908 or reference and control signal generator(s) 918. Control of clock source(s) 908 can cause output pulses configured to facilitate row controller 904 and column controller 906 implementing the particular functionality. Output pulses can be transferred to selected bit lines by column controller 906, for instance, or word lines by row controller 904, for instance.

In connection with FIG. 10, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 10:
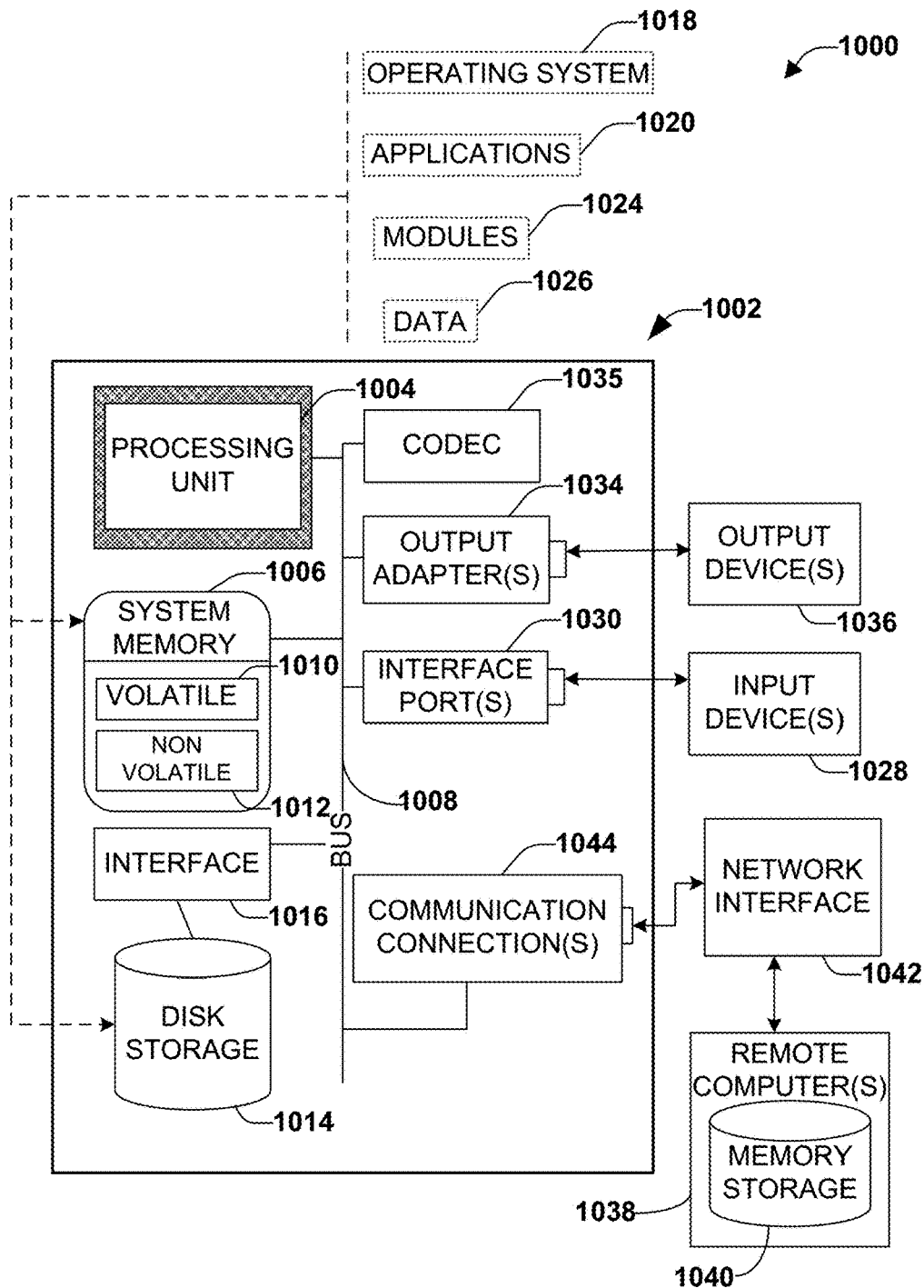
FIG. 10 illustrates a block diagram of an example computing environment that can be implemented in conjunction with various embodiments.

With reference to FIG. 10, a suitable operating environment 1000 for implementing various aspects of the claimed subject matter includes a computer 1002. The computer 1002 includes a processing unit 1004, a system memory 1006, a codec 1035, and a system bus 1008. The system bus 1008 communicatively inter-connects system components including, but not limited to, the system memory 1006 to the processing unit 1004. The processing unit 1004 can be any of various available processors. Dual microprocessors and other multiprocessor architectures also can be employed as the processing unit 1004.

The system bus 1008 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1006 includes volatile memory 1010 and non-volatile memory 1014, which can employ one or more of the disclosed memory architectures, in various embodiments. The basic input/output system (BIOS), containing the basic routines to transfer information between elements within the computer 1002, such as during start-up, is stored in non-volatile memory 1012. In addition, according to present innovations, codec 1035 may include at least one of an encoder or decoder, wherein the at least one of an encoder or decoder may consist of hardware, software, or a combination of hardware and software. Although, codec 1035 is depicted as a separate component, codec 1035 may be contained within non-volatile memory 1012. By way of illustration, and not limitation, non-volatile memory 1012 can include read only memory (ROM), programmable ROM (PROM), electrically programmable ROM (EPROM), electrically erasable programmable ROM (EEPROM), Flash memory, or two-terminal memory (e.g., resistive-switching memory). Non-volatile memory 1012 can employ one or more of the disclosed memory architectures, in at least some disclosed embodiments. Moreover, non-volatile memory 1012 can be computer memory (e.g., physically integrated with computer 1002 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 1010 includes random access memory (RAM), which acts as external cache memory, and can also employ one or more disclosed memory architectures in various embodiments. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM), and so forth.

Computer 1002 may also include removable/non-removable, volatile/non-volatile computer storage medium. FIG. 10 illustrates, for example, disk storage 1014. Disk storage 1014 includes, but is not limited to, devices such as a magnetic disk drive, solid state disk (SSD) floppy disk drive, tape drive, Jaz drive, Zip drive, LS-100 drive, flash memory card, or memory stick. In addition, disk storage 1014 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1014 to the system bus 1008, a removable or non-removable interface is typically used, such as interface 1016. It is appreciated that disk storage 1014 can store information related to a user. Such information might be stored at or provided to a server or to an application running on a user device. In one embodiment, the user can be notified e.g., by way of output device(s) 1036) of the types of information that are stored to disk storage 1014 and/or transmitted to the server or application. The user can be provided the opportunity to opt-in or opt-out of having such information collected and/or shared with the server or application (e.g., by way of input from input device(s) 1028).

It is to be appreciated that FIG. 10 describes software that acts as an intermediary between users and the basic computer resources described in the suitable operating environment 1000. Such software includes an operating system 1018. Operating system 1018, which can be stored on disk storage 1014, acts to control and allocate resources of the computer 1002. Applications 1020 take advantage of the management of resources by operating system 1018 through program modules 1024, and program data 1026, such as the boot/shutdown transaction table and the like, stored either in system memory 1006 or on disk storage 1014. It is to be appreciated that the claimed subject matter can be implemented with various operating systems or combinations of operating systems.

A user enters commands or information into the computer 1002 through input device(s) 1028. Input devices 1028 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1004 through the system bus 1008 via interface port(s) 1030. Interface port(s) 1030 include, for example, a serial port, a parallel port, a game port, and a universal serial bus (USB). Output device(s) 1036 use some of the same type of ports as input device(s) 1028. Thus, for example, a USB port may be used to provide input to computer 1002 and to output information from computer 1002 to an output device 1036. Output adapter 1034 is provided to illustrate that there are some output devices, such as monitors, speakers, and printers, among other output devices, which require special adapters. The output adapter 1034 can include, by way of illustration and not limitation, video and sound cards that provide a means of connection between the output device 1036 and the system bus 1008. It should be noted that other devices and/or systems of devices provide both input and output capabilities such as remote computer(s) 1038.

Computer 1002 can operate in a networked environment using logical connections to one or more remote computers, such as remote computer(s) 1038. The remote computer(s) 1038 can be a personal computer, a server, a router, a network PC, a workstation, a microprocessor based appliance, a peer device, a smart phone, a tablet, or other network node, and typically includes many of the elements described relative to computer 1002. For purposes of brevity, only a memory storage device 1040 is illustrated with remote computer(s) 1038. Remote computer(s) 1038 is logically connected to computer 1002 through a network interface 1042 and then connected via communication connection(s) 1044. Network interface 1042 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks such as Integrated Services Digital Networks (ISDN) and variations thereon, packet switching networks, and Digital Subscriber Lines (DSL).

Communication connection(s) 1044 refers to the hardware/software employed to connect the network interface 1042 to the system bus 1008. While communication connection 1044 is shown for illustrative clarity inside computer 1002, it can also be external to computer 1002. The hardware/software necessary for connection to the network interface 1042 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject disclosure. Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A circuit, comprising:
    a non-volatile switch comprising an input node, an output node and a control gate, the input node connected to a first conductive line of a switching block routing array and the output node connected to a second conductive line of the switching block routing array;
    a volatile switch having a first contact and a second contact, the second contact is conductively connected to the control gate of the non-volatile switch; and
    a program circuit configured to selectively provide a voltage from a voltage source to the first contact of the volatile switch.

2. The circuit of claim 1, further comprising a capacitor having a first terminal and a second terminal, wherein the second terminal is conductively connected to the first contact of the volatile switch and the first terminal connected to the program circuit.

3. The circuit of claim 2, wherein the capacitor, the volatile switch and the control gate are connected respectively in electrical series.

4. The circuit of claim 2, wherein a magnitude of the voltage provided by the voltage source is divided among the capacitor, the volatile switch and the control gate of the non-volatile switch in proportion to the respective capacitances of the capacitor, the volatile switch and the control gate of the non-volatile switch.

5. The circuit of claim 1, wherein the volatile switch is a volatile resistive switching device comprising a resistive switching material formed between the first contact and the second contact, wherein the first contact is formed of a first metal-containing material and the second contact is formed of a second metal-containing material.

6. The circuit of claim 5, wherein the first metal-containing material is a first metal alloy comprising a first elemental metal and a first nonmetal, and the second metal-containing material is a second metal alloy comprising a second elemental metal and a second nonmetal, and at least one of:
    the first metal alloy and the second metal alloy are the same; or
    the first elemental metal and the second elemental metal are different, the first nonmetal and the second nonmetal are different or a first ratio of the first elemental metal to the first nonmetal is different from a second ratio of the second elemental metal to the second nonmetal.

7. The circuit of claim 5, wherein the first metal-containing material is a first metallic compound and the second metal-containing material is a second metallic compound, and at least one of:
    the first metallic compound and the second metallic compound are the same; or
    the first metallic compound and the second metallic compound comprise different elemental metals, different nonmetallic elements, or different ratios of elemental metal and nonmetallic element.

8. The circuit of claim 5, wherein the resistive switching material is selected from a group consisting of: an insulator, a non-stoichiometric oxide, a non-stoichiometric silicon oxide, SiOx where x is a positive number between about 0.1 and about 2, a chalcogenide, a solid-electrolyte comprising Ge, Sb, S and Te, and a metal-doped material.

9. The circuit of claim 5, wherein:
    the first contact is configured to provide first conductive ions of the first metal-containing material to the resistive switching material in response to a first voltage applied across the volatile switch;
    the second contact is configured to provide second conductive ions of the second metal-containing material to the resistive switching material in response to a second voltage, having different polarity from the first voltage, applied across the volatile switch; and the resistive switching material is configured to be permeable to the first conductive ions and to the second conductive ions.
10. The circuit of claim 9, wherein:
the first conductive ions form a conductive filament facilitating electrical continuity between the first contact and the second contact in response to the first voltage exceeding a first threshold magnitude; and
the second conductive ions form a second conductive filament facilitating electrical continuity between the second contact and the first contact in response to the second voltage exceeding a second threshold magnitude of the different polarity from the first voltage, wherein the volatile switch lacks electrical continuity between the first contact and the second contact for voltages less than the first threshold magnitude and the second threshold magnitude.

11. The circuit of claim 5, further comprising a first ion layer disposed between the first contact and the resistive switching material or a second ion layer disposed between the second contact and the resistive switching material, wherein the first ion layer or the second ion layer are formed of a material selected from a group consisting of: an ion conductor, a solid-electrolyte, a metal oxide and a metal oxide alloy.

12. The circuit of claim 1, wherein the non-volatile switch is a transistor, and wherein the switching block routing array is implemented as part of a field programmable gate array.

13. A configuration bit for a node of a switching block routing array, comprising:
a transistor element having a control gate, a first terminal coupled to an input node of the switching block routing array and a second terminal coupled to an output node of the switching block routing array;
a two-terminal volatile resistive switching device, having a second electrode connected to the control gate and a first electrode; and
a programming input provided to the first electrode of the two-terminal volatile resistive switching device, wherein:
the programming input supplies a signal to the two-terminal volatile resistive switching device via the first electrode,
the two-terminal volatile resistive switching device has a high resistance state in response to a magnitude of the signal being zero or about zero,
the two-terminal volatile resistive switching device transitions to a low resistance state in response to the magnitude increasing to a non-zero threshold voltage, and
the two-terminal volatile resistive switching device transitions from the low electrical resistance to the high electrical resistance in response to the magnitude decreasing below the non-zero threshold voltage, or below a second non-zero threshold voltage.

14. The configuration bit of claim 13, further comprising a capacitor positioned electrically in serial between the programming input and the two-terminal volatile resistive switching device, having a first node connected to the first electrode of the two-terminal volatile resistive switching device and a second node connected to the programming input.

15. The configuration bit of claim 13, the programming input comprises a transistor configured to selectively connect or disconnect a voltage source to the configuration bit.

16. The configuration bit of claim 13, wherein a ratio of electrical resistances of the high resistance state and the low resistance state at approximately the non-zero threshold voltage is within a range from about 10,000 to 1 to about 10,000,000 to 1.

17. The configuration bit of claim 13, wherein the two-terminal volatile resistive switching device comprises a first metal-containing layer as the second electrode, a second metal-containing layer as the first electrode, and a volatile resistance switching layer positioned between the first metal-containing layer and the second metal-containing layer, wherein the volatile resistance switching layer is at least weakly permeable to a first metal of the first metal-containing layer or to a second metal of the second metal-containing layer.

18. The configuration bit of claim 17, wherein the first metal-containing layer and the second metal-containing layer comprise Ag and Si, in a ratio of between about 95% to less than 100% of Ag and between about 5% to greater than 0% of Si.

19. The configuration bit of claim 13, wherein the programming input is configured to provide a program signal that:
increases over time to a peak program voltage and, upon reaching the non-zero threshold voltage that is equal to or less than the peak program voltage, causes the two-terminal volatile resistive switch to enter the low resistance state and a net charge to accumulate at the control gate; and
decreases over time from the peak program voltage to below the non-zero threshold voltage or below the second non-zero threshold voltage that is less than the non-zero threshold voltage, and causes the two-terminal volatile resistive switch to enter the high resistance state and to trap at least a subset of the net charge at the control gate.

20. The configuration bit of claim 19, wherein the subset of the net charge at the control gate provides a control gate voltage that activates the transistor element and electrically connects the input node with the output node, and wherein the switching block routing array is implemented as part of a field programmable gate array.

* * * * *